(12) United States Patent
Ho et al.

(10) Patent No.: US 12,062,604 B2
(45) Date of Patent: Aug. 13, 2024

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Kuan-Lin Ho, Hsinchu (TW); Chin-Liang Chen, Kaohsiung (TW); Jiun-Yi Wu, Taoyuan (TW); Chi-Yang Yu, Taoyuan (TW); Yu-Min Liang, Taoyuan (TW); Wei-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/350,730

(22) Filed: Jul. 11, 2023

(65) Prior Publication Data
US 2023/0352389 A1 Nov. 2, 2023

Related U.S. Application Data

(63) Continuation of application No. 17/724,508, filed on Apr. 20, 2022, now Pat. No. 11,749,594, which is a
(Continued)

(51) Int. Cl.
*H01L 21/683* (2006.01)
*H01L 21/48* (2006.01)
(Continued)

(52) U.S. Cl.
CPC .... *H01L 23/49833* (2013.01); *H01L 21/4857* (2013.01); *H01L 21/6835* (2013.01);
(Continued)

(58) Field of Classification Search
CPC .......... H01L 23/49833; H01L 21/4857; H01L 21/6835; H01L 23/49822; H01L 23/49838;
(Continued)

(56) References Cited

U.S. PATENT DOCUMENTS 7,626,829 B2 * 12/2009 Watanabe ......... H01L 23/49822
361/767
7,696,613 B2 * 4/2010 Nakamura ........ H01L 23/49822
257/776
(Continued)

*Primary Examiner* — Vu A Vu
(74) *Attorney, Agent, or Firm* — JCIPRNET

(57) ABSTRACT

A semiconductor structure includes a redistribution structure, topmost and bottom conductive terminals. The redistribution structure includes a topmost pad in a topmost dielectric layer, a topmost under-bump metallization (UBM) pattern directly disposed on the topmost pad and the topmost dielectric layer, a bottommost UBM pad embedded in a bottommost dielectric layer, and a bottommost via laterally covered by the bottommost dielectric layer. Bottom surfaces of the topmost pad and the topmost dielectric layer are substantially coplanar, bottom surfaces of the bottommost UBM pad and the bottommost dielectric layer are substantially coplanar, the bottommost via is disposed on a top surface of the bottommost UBM pad, top surfaces of the bottommost via and the bottommost dielectric layer are substantially coplanar. The topmost conductive terminal lands on a recessed top surface of the topmost UBM pattern, and the bottommost conductive terminal lands on the planar bottom surface of the bottommost UBM.

20 Claims, 34 Drawing Sheets

Related U.S. Application Data continuation of application No. 16/916,046, filed on Jun. 29, 2020, now Pat. No. 11,315,862.

(60) Provisional application No. 62/968,160, filed on Jan. 31, 2020.

(51) Int. Cl.
*H01L 23/00* (2006.01)
*H01L 23/498* (2006.01)

(52) U.S. Cl.
CPC .. *H01L 23/49822* (2013.01); *H01L 23/49838* (2013.01); *H01L 24/16* (2013.01); *H01L 2221/6835* (2013.01); *H01L 2224/16227* (2013.01)

(58) Field of Classification Search
CPC ............. H01L 24/16; H01L 2221/6835; H01L 2224/16227; H01L 24/11; H01L 24/13; H01L 24/32; H01L 24/73; H01L 24/81; H01L 24/92; H01L 2224/1132; H01L 2224/11334; H01L 2224/1145; H01L 2224/1146; H01L 2224/11849; H01L 2224/13111; H01L 2224/13113; H01L 2224/13116; H01L 2224/13139; H01L 2224/13147; H01L 2224/13155; H01L 2224/32225; H01L 2224/73204; H01L 2224/81192; H01L 2924/15311; H01L 2924/3511; H01L 2924/3512; H01L 23/49816; H01L 2221/68313; H01L 2224/81815; H01L 2924/15313; H01L 21/6836; H01L 2221/68345
USPC ....................................................... 257/668
See application file for complete search history.

(56) References Cited

U.S. PATENT DOCUMENTS

| | | | |
|---|---|---|---|
| 8,119,451 B2* | 2/2012 | Miyazaki | H01L 21/4846 |
| | | | 438/612 |
| 8,379,401 B2* | 2/2013 | Kobayashi | H05K 3/28 |
| | | | 361/767 |
| 8,847,387 B2* | 9/2014 | Hsiao | H01L 23/49827 |
| | | | 257/737 |
| 8,993,380 B2 | 3/2015 | Hou et al. | |
| 9,210,808 B2* | 12/2015 | Kaneko | H01L 21/6835 |
| 9,281,254 B2 | 3/2016 | Yu et al. | |
| 9,299,649 B2* | 3/2016 | Chiu | H01L 21/4853 |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,991,190 B2* | 6/2018 | Huang | H01L 23/3121 |
| 10,325,869 B2* | 6/2019 | Choi | H01L 23/481 |
| 2017/0263489 A1* | 9/2017 | Hu | H01L 21/486 |
| 2018/0040546 A1* | 2/2018 | Yu | H01L 21/4875 |

* cited by examiner

SEMICONDUCTOR STRUCTURE AND MANUFACTURING METHOD THEREOF

CROSS-REFERENCE TO RELATED APPLICATION

This application is a continuation application of and claims the priority benefit of a prior application Ser. No. 17/724,508, filed on Apr. 20, 2022, now allowed. The prior application Ser. No. 17/724,508 is a continuation application of and claims the priority benefit of a prior application Ser. No. 16/916,046, filed on Jun. 29, 2020. The prior application Ser. No. 16/916,046 claims the priority benefit of U.S. provisional application Ser. No. 62/968,160, filed on Jan. 31, 2020. The entirety of each of the above-mentioned patent applications is hereby incorporated by reference herein and made a part of this specification.

BACKGROUND

With the advancement of modern technologies, integrated circuits having more functions and greater performance are increasingly demanded. In the packaging of integrated circuits, semiconductor dies are packaged onto package components, which include the circuitry used to route electrical signals. In the conventional flow, the package components is picked and placed on the fan-out structure before the laser drill and clean process, so the subsequently formed bump is easy to crack due to the high warpage issue and the yield of the packaging process is adversely affected. Therefore, there is the need for more creative packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
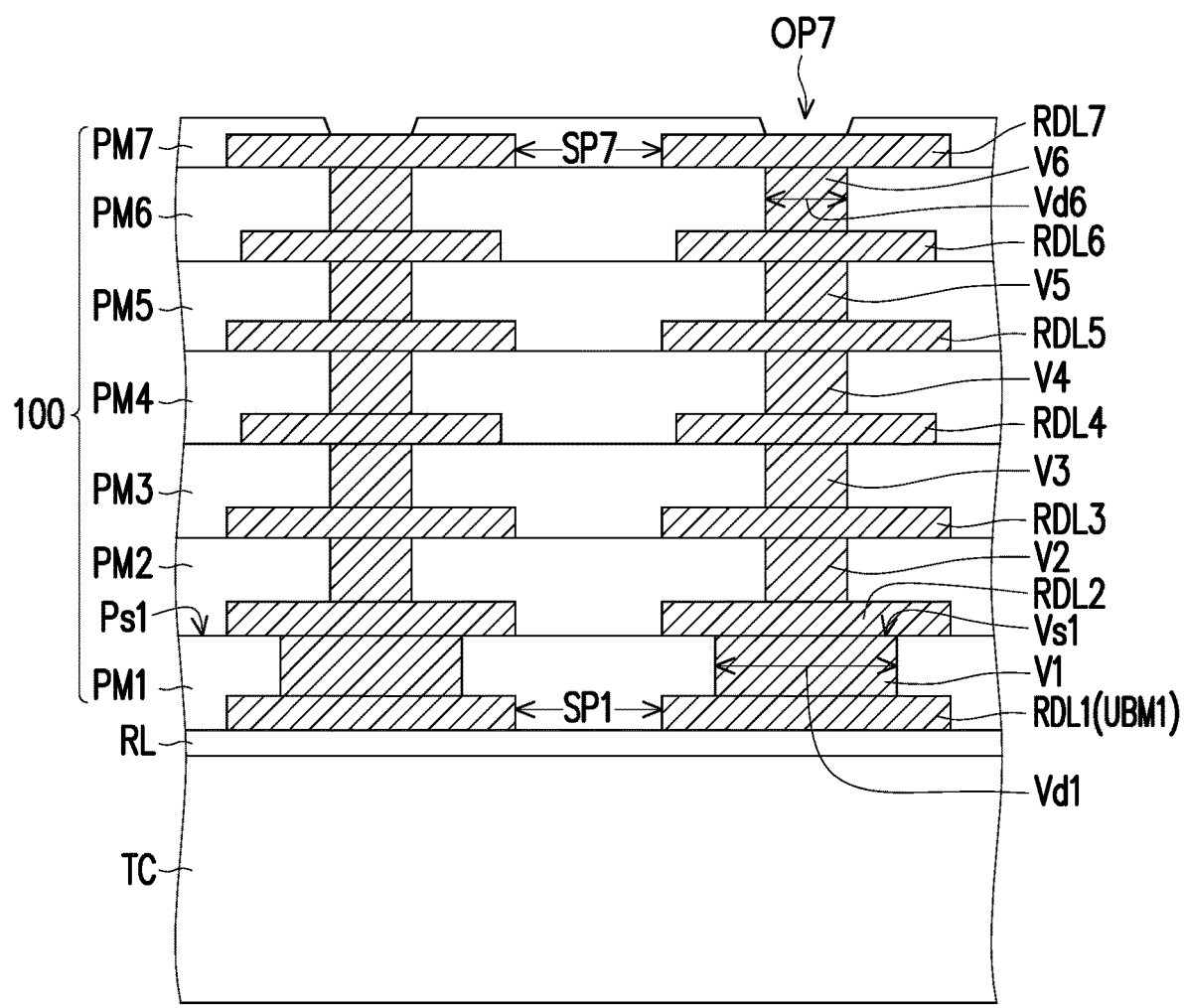
FIGS. 1A-1H are schematic cross-sectional views of various stages of manufacturing a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1H are schematic cross-sectional views of various stages of manufacturing a semiconductor structure in accordance with some embodiments, and FIGS. 2A-2H are schematic top views corresponding to FIGS. 1A-1H in accordance with some embodiments.

Figure 2A:
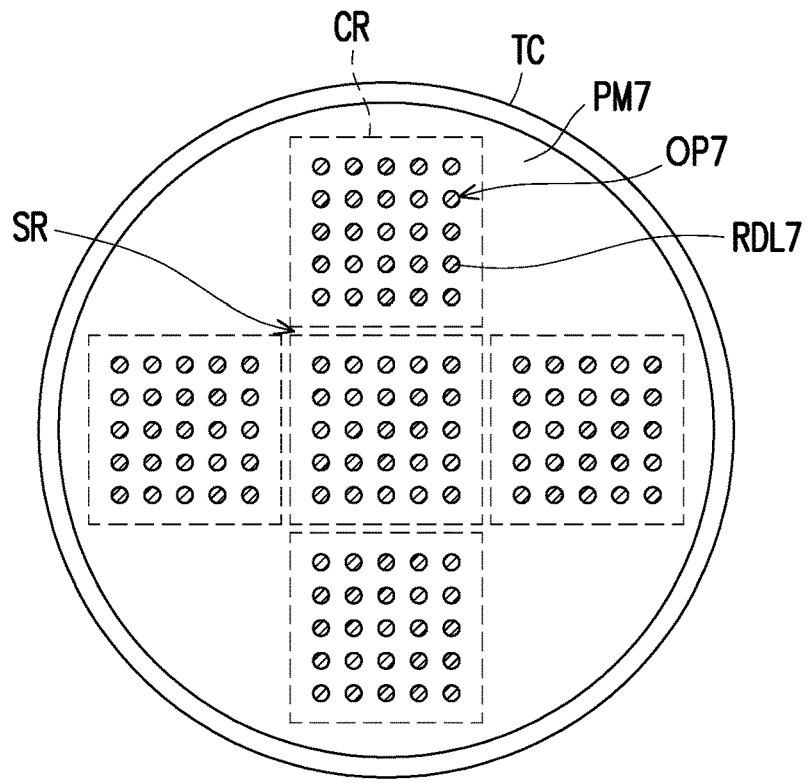
FIGS. 2A-2H are schematic top views corresponding to FIGS. 1A-1H in accordance with some embodiments.

Referring to FIGS. 1A and 2A, a redistribution structure 100 is formed over a temporary carrier TC. For example, the temporary carrier TC includes glass, silicon, metal, ceramic, combinations thereof, multi-layers thereof, and/or the like. In some embodiments, the temporary carrier TC is provided in a wafer form. Alternatively, the temporary carrier TC may have a rectangular shape or other suitable shape. The temporary carrier TC may be planar to accommodate the formation of features subsequently formed thereon. In some embodiments, the temporary carrier TC is provided with a release layer RL to facilitate a subsequent de-bonding of the temporary carrier TC. The release layer RL may include a layer of light-to-heat-conversion (LTHC) release coating and a layer of associated adhesive. Other suitable release material (e.g., pressure sensitive adhesives, radiation curable adhesives, combinations of these, etc.), which may be removed along with the temporary carrier TC from the overlying structures that will be formed in subsequent steps, may be used. Alternatively, the release layer RL is omitted.

In some embodiments, the formation of the redistribution structure 100 includes at least the following steps. A first conductive pattern RDL1 may be formed over the temporary carrier TC. In some embodiments in which the temporary carrier TC is provided with the release layer RL, the first conductive pattern RDL1 is deposited on the release layer RL. For example, a seed layer (not shown) is initially formed on the release layer RL. The seed layer may be a Ti/Cu bilayer, a copper layer, or other suitable metal layer, and may be deposited using any suitable deposition technique such as physical vapor deposition (PVD), e.g., sputtering, evaporation, etc. Next, a patterned photoresist layer having openings (also not shown) may be formed to partially cover the seed layer using such as a spin-coating process, lithography and etching processes, or the like. A conductive material may be formed on the seed layer within the openings of the patterned photoresist layer. The conductive material may include copper, titanium, tungsten, aluminum, another metal, the like, or a combination thereof, and may be formed by such as electroplating or electroless plating, or the like. Subsequently, the patterned photoresist layer may be removed by a suitable removal process such as ashing, stripping, or the like.

After the removal of the patterned photoresist layer, those portions of the seed layer that were covered by the patterned photoresist layer may be removed by any suitable process (e.g., wet etching, dry etching, or the like), and the conductive material may serve as an etch mask during the removal process of the seed layer. The remaining portions of the seed layer and the conductive material thereon collectively form the first conductive pattern RDL1. The first conductive pattern RDL1 may be or may include under-bump metallization (UBM) pads for the subsequently formed element landing thereon. In some embodiments, the first conductive pattern RDL1 is referred to as a first UBM pattern UBM1 in the disclosure. In a top-down view, the first UBM pattern UBM1 may be formed in a desired shape, such as a circular, oval, square, rectangular, or polygonal shape, although any desired shape may alternatively be formed.

In some embodiments, after forming the first conductive pattern RDL1, a first conductive via V1 is formed on the first conductive pattern RDL1. The material of the first conductive via V1 may be similar to the first conductive pattern RDL1. For example, a patterned photoresist layer (not shown) is formed on the release layer RL to partially cover the first conductive pattern RDL1. The openings of the patterned photoresist layer may accessibly reveal desired parts of the first conductive pattern RDL1. Next, the conductive material may be formed on the first conductive pattern RDL1 within the openings of the patterned photoresist layer by such as electroplating, electroless plating, or other suitable deposition process. Subsequently, the patterned photoresist layer may be removed. The conductive material plated on the first conductive pattern RDL1 may form the first conductive via V1. In some embodiments, the first conductive pattern RDL1 and the first conductive via V1 are collectively viewed as a redistribution layer at the first level of the redistribution structure 100.

In some embodiments, after forming the first conductive via V1, a first dielectric layer PM1 is formed over the temporary carrier TC to cover the first conductive pattern RDL1 and the first conductive via V1. For example, a dielectric material is formed on the release layer RL by a process such as lamination, spin-coating, CVD, a combination thereof, etc. The dielectric material may be or may include polybenzoxazole (PB0), polyimide (PI), benzocyclobutene (BCB), prepreg, Ajinomoto build-up film (ABF), an oxide (e.g., silicon oxide), a nitride (e.g., silicon nitride), a photosensitive polymer material, a combination thereof, and/or the like. The dielectric material is optionally planarized, such as by a chemical mechanical polish (CMP) or a mechanical grinding, to form the first dielectric layer PM1. For example, the first dielectric layer PM1 laterally covers the first conductive via V1. In some embodiments, the top surface Ps1 of the first dielectric layer PM1 is substantially leveled with the first conductive vias V1. In some embodiments, the first conductive vias V1 includes substantially vertical sidewalls relative to the top surface of the underlying first conductive pattern RDL1. In some embodiments, the first conductive pattern RDL1 and the first conductive via V1 embedded in the first dielectric layer PM1 are collectively viewed as the first level of the redistribution structure 100.

Continue to FIG. 1A, a second conductive pattern RDL2, second conductive vias V2, and a second dielectric layer PM2 are then formed on the first conductive vias V1 and the first dielectric layer PM1. The second conductive pattern RDL2 and the second conductive vias V2 are collectively viewed as a redistribution layer at the second level to provide additional routing. In some embodiments, the second conductive pattern RDL2 is initially formed on the first conductive vias V1 and may extend onto the first dielectric layer PM1 using the processes similar to the formation of the first conductive pattern RDL1. Next, the second conductive vias V2 is formed on the second conductive pattern RDL2 using the processes similar to the formation of the first conductive vias V1. The materials of the second conductive pattern RDL2 and the second conductive vias V2 may be similar to those of the first conductive pattern RDL1 and the first conductive vias V1. Subsequently, the second dielectric layer PM2 is formed on the first dielectric layer PM1 to cover the second conductive vias V2 and the second conductive pattern RDL2 using the processes similar to the formation of the first dielectric layer PM1. The material of the second dielectric layer PM2 may be similar to or different from the first dielectric layer PM1 depending on product and process requirements.

In some alternative embodiments, the first dielectric layer PM1 having openings is formed over the temporary carrier TC, and then the first conductive vias V1 may be formed on the first conductive pattern RDL1 within the openings of the first dielectric layer PM1. In some embodiments, the first conductive vias V1 includes inclined sidewalls relative to the top surface of the underlying first conductive pattern RDL1. The second conductive pattern RDL2 and the first conductive vias V1 may be formed during the same step. Under this scenario, the planarization process may be omitted, and there is no visible interface between the second conductive pattern RDL2 and the underlying first conductive vias V1.

Still referring to FIG. 1A, additional conductive patterns (e.g., RDL3, RDL4, RDL5, RDL6, and RDL7), conductive vias (e.g., V3, V4, V5, and V6), and dielectric layers (e.g., PM3, PM4, PM5, PM6, and PM7) may be formed over the second conductive vias V2 and the second dielectric layer PM2 to provide additional routing. The dielectric layers and the redistribution layers may be alternately formed, and may be formed using processes and materials similar to those used for the underlying dielectric layer or the redistribution layers. The steps of forming the conductive patterns, the conductive vias, and the dielectric layers may be repeated to form the redistribution structure 100. It is noted that the redistribution structure 100 shown in FIG. 1A is merely an example and may have any suitable number of dielectric layers or redistribution layers. For example, the redistribution structure 100 includes an N-th conductive pattern and an N-th conductive via that are embedded by an N-th polymer layer, where N is a positive integer. In other embodiments, the redistribution structure 100 is formed in a different process than described herein.

Still referring to FIG. 1A, in some embodiments, the bottommost conductive via (e.g., the first conductive via V1) may have a critical dimension greater than the critical dimension of the topmost conductive via (e.g., the sixth conductive via V6). For example, the critical dimension (or diameter) Vd1 of the first conductive via V1 is greater than the critical dimension (or diameter) Vd6 of the sixth conductive via V6. For example, the critical dimension Vd1 of the first conductive via V1 is in a range of about 30 µm and about 1000 µm. The critical dimension Vd6 of the sixth conductive via V6 may range from about 0.5 µm to about 50 µm. In some embodiments, the diameters of the conductive vias are gradually reduced layer by layer from the bottommost level of the redistribution structure 100 to the topmost level of the redistribution structure 100. It is also noted that the arrangement of the conductive vias V1-V6 shown in FIG. 1A is merely an example, and the conductive vias V1-V6 may be fully staggered or partially staggered in the cross-sectional view. In some embodiments, the redistribution structure 100 is a fan-out structure. The redistribution layers in the redistribution structure 100 may be fan-out from the topmost level (e.g., RDL7) to the bottommost level (e.g., RDL1). For example, the spacing SP1 of the first conductive pattern RDL1 at the bottommost level of the redistribution structure 100 is greater than the spacing SP7 of the seventh conductive pattern RDL7 at the topmost level of the redistribution structure 100. For example, the spacing SP1 of the first conductive pattern RDL1 is in a range of about 30 µm and about 1000 µm. The spacing SP7 of the seventh conductive pattern RDL7 at the topmost level of the redistribution structure 100 may range from about 0.1 µm to about 30 µm.

In some embodiments, at least the topmost dielectric layer (e.g., the seventh dielectric layer PM7) is formed differently from the underlying dielectric layer (e.g., the sixth dielectric layers PM6) or any other dielectric layer below the topmost dielectric layer. For example, the topmost dielectric layer (e.g., the seventh dielectric layer PM7) is formed of a polymer material such as PBO, PI, or the like, and the dielectric layers below the topmost dielectric layer may be formed of a different material, such as by being formed of an ABF or a prepreg material. In some embodiments, the topmost dielectric layer (e.g., the seventh dielectric layer PM7) has a larger thickness than the underlying dielectric layer (e.g., the sixth dielectric layers PM6). However, any combination of materials and thicknesses may be utilized.

Still referring to FIG. 1A and with reference to FIG. 2A, in some embodiments, the topmost dielectric layer (e.g., the seventh dielectric layer PM7) includes openings OP7 accessibly exposing at least a portion of the underlying conductive pattern (e.g., the seventh conductive pattern RDL7) for further electrical connection. In some embodiments, the redistribution layers including the conductive vias and the conductive patterns are formed within a plurality of circuit regions CR. For example, in a top-down view, the circuit regions CR are arranged in an array over the temporary carrier TC. The openings OP7 of the topmost dielectric layer (e.g., the seventh dielectric layer PM7) may be distributed within the circuit regions CR. In some embodiments, the neighboring circuit regions CR are separated by a scribe line region SR. During the subsequent singulation process, scribe lines may be located in the scribe line region SR. Each of the circuit regions CR may be similarly sized and shaped, although in other embodiments the circuit regions CR may have different sizes and shapes.

Figure 1B:
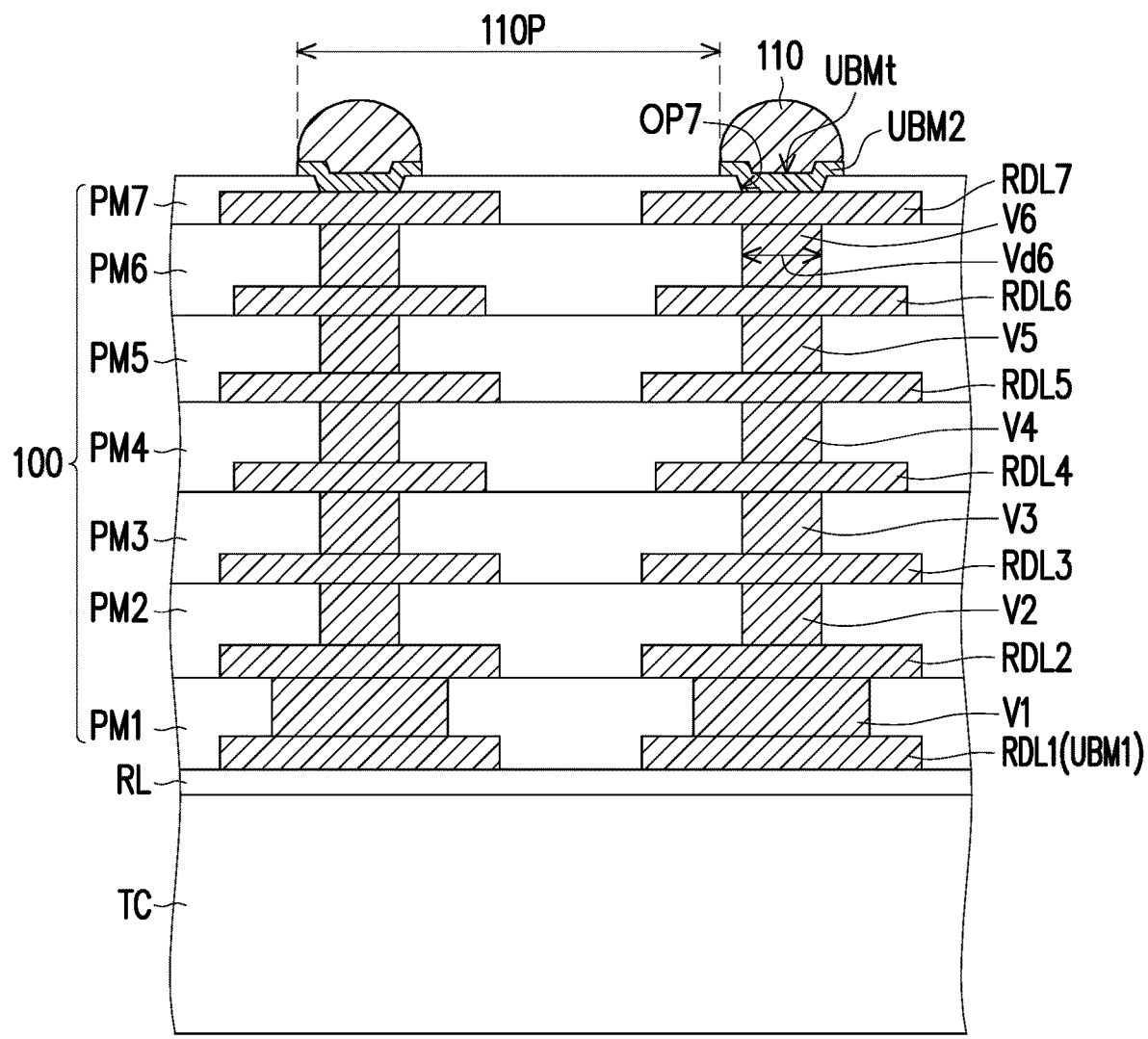
Figure 2B:
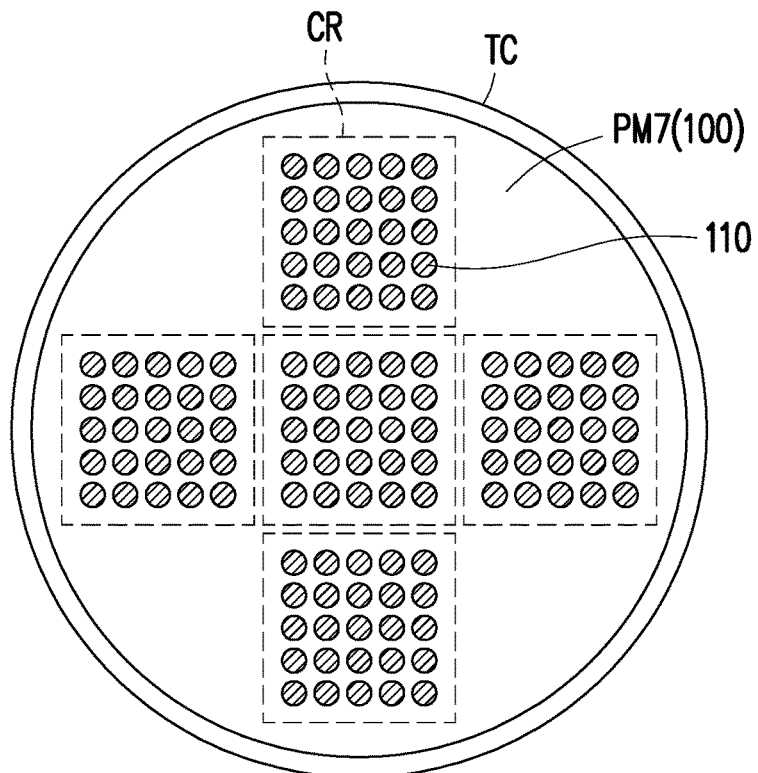

Referring to FIGS. 1B and 2B, a second UBM pattern UBM2 and conductive terminals 110 may be sequentially formed in the openings OP7 of the topmost dielectric layer (e.g., the seventh dielectric layer PM7) for further electrical connection. The second UBM pattern UBM2 may be a single layer or may include a plurality of layers conformally formed in the openings OP7 and on the topmost dielectric layer (e.g., the seventh dielectric layer PM7). In some embodiments, the second UBM pattern UBM2 has a recessed top surface UBMt corresponding to each of the openings OP7. For example, the second UBM pattern UBM2 includes multiple layers of conductive materials, such as a layer of titanium, a layer of copper, and a layer of nickel. In such embodiments, the layer of titanium is conformally formed on the topmost dielectric layer (e.g., the seventh dielectric layer PM7) to be in physical and electrical contact with the conductive pattern (e.g., the seventh conductive pattern RDL7) exposed by the openings OP7 of the topmost dielectric layer (e.g., the seventh dielectric layer PM7), and then the layer of copper and the layer of nickel are sequentially formed on the layer of titanium. In some embodiments, the second UBM pattern UBM2 includes an arrangement of titanium/titanium tungsten/copper, an arrangement of copper/nickel/gold, or other materials or layers of material. Each layer of the second UBM pattern UBM2 may be formed by such as plating sputtering, evaporation, or other suitable deposition process depending upon the desired materials. After deposition of the desired layers, lithography and etching processes may be performed to form the second UBM pattern UBM2 in a desired shape. For example, the shape of the second UBM pattern UBM2 may be circular, oval, square, rectangular, polygon, etc.

In some embodiments, the conductive terminals 110 are formed on the second UBM pattern UBM2. For example, a pitch 110P of the adjacent conductive terminals 110 is less than 130 µm. In some embodiments, the pitch 110P of the adjacent conductive terminals 110 is less than 10 µm. It is noted that the pitches of the conductive terminals 110 may be adjusted depending on I/O connectors of a semiconductor device (e.g., the semiconductor device 500 shown in FIG. 11) that is to be mounted thereon. The conductive terminals 110 may be or may include solder balls, ball grid array (BGA) connectors, metal pillars, controlled collapse chip connection (C4) bumps, micro bumps, electroless nickel-electroless palladium-immersion gold (ENEPIG) formed bumps, or the like. For example, the conductive terminals 110 are formed by such as plating, ball placement, evaporation, printing, etc. In some embodiments, the conductive terminals 110 includes solder bump formed by landing solder balls on the recessed top surface UBMt of the second UBM pattern UBM2, and then reflowing the solder material. In some embodiments, the respective conductive terminal 110 includes a lead-free pre-solder layer, Sn—Ag, or solder material including alloys of tin, lead, nickel, bismuth, silver, copper, combinations thereof, or the like. In some embodiments, the conductive terminals 110 are formed by plating a solder layer with lithography process followed by reflowing process to reshape the solder layer into the desired bump shapes. In some embodiments, the reflow process is omitted. Alternatively, the second UBM pattern UBM2 is omitted, and the conductive terminals 110 are in physical and electrical contact with the underlying conductive pattern (e.g., the seventh conductive pattern RDL7). The conductive terminals 110 and the second UBM pattern UBM2 may be formed in a different process as will be described later in other embodiments.

Figure 1C:
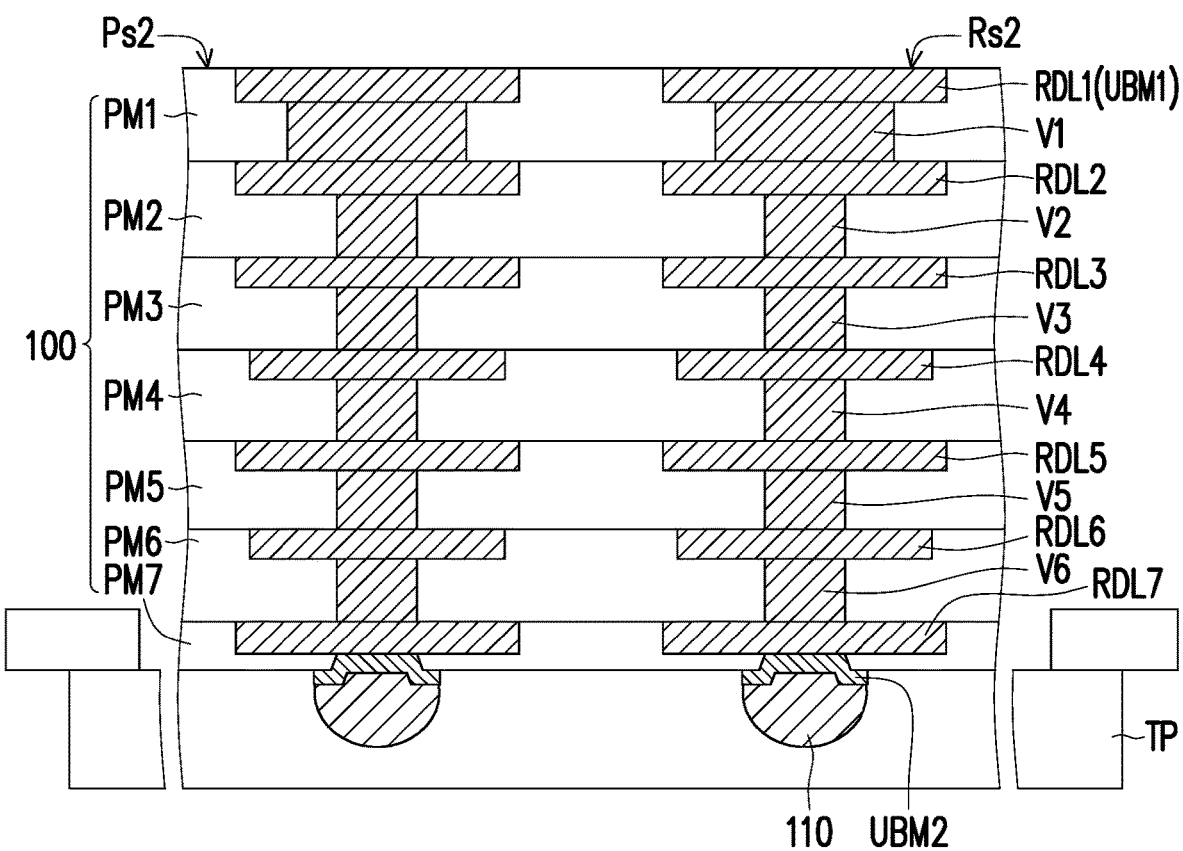
Figure 2C:
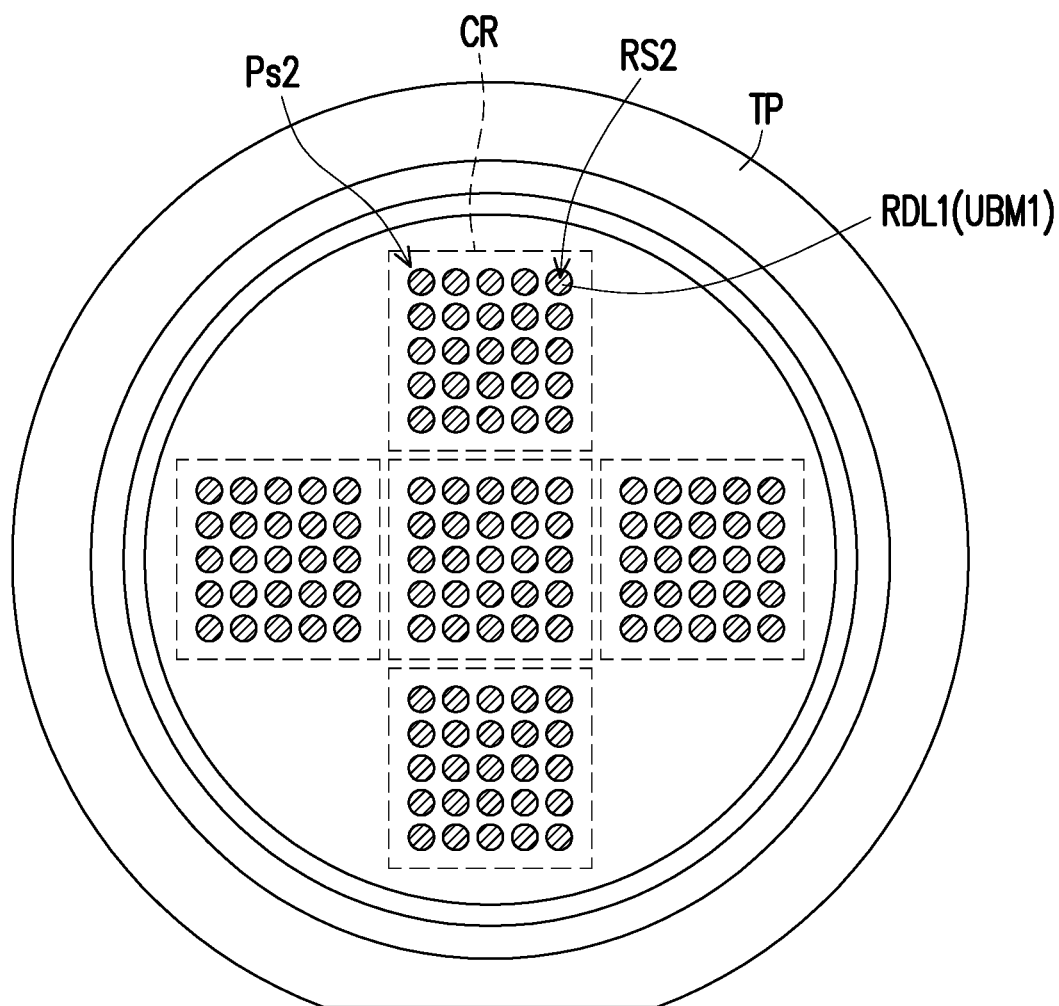

Referring to FIGS. 1C and 2C and also with reference to FIG. 1B, the temporary carrier TC may be de-bonded from the redistribution structure 100, and the redistribution structure 100 may be placed on a tape frame TP. In some embodiments, the temporary carrier TC and the release layer RL are physically separated and removed from the redistribution structure 100, so that the first dielectric layer PM1 and the first conductive pattern RDL1 (i.e. the first UBM pattern UBM1) are exposed for further processing. In some embodiments, the exposed surface Ps2 of the first dielectric layer PM1 and the exposed surface Rs2 of the first conductive pattern RDL1 are planar surfaces. For example, the exposed surface Ps2 of the first dielectric layer PM1 and the exposed surface Rs2 of the first conductive pattern RDL1 are substantially leveled. The first conductive pattern RDL1 (i.e. the first UBM pattern UBM1) exposed by the first dielectric layer PM1 may be formed in a desired shape, such as a circular, oval, square, rectangular, or polygonal shape, although any desired shape may alternatively be formed.

The temporary carrier TC may be removed from the redistribution structure 100 by a thermal process, a mechanical peel-off process, a grinding process, an etching process, combinations of these, and may include additional cleaning process. In some embodiments, suitable energy source, e.g., UV light, UV laser, etc., is applied to weaken the bonds of the release layer RL, so that the temporary carrier TC may be separated from the remaining structure. Next, the resulting structure may be flipped over, and the conductive terminals 110 may be attached to the tape frame TP. The topmost dielectric layer (e.g., the seventh dielectric layer PM7) may face the tape frame TP. In some embodiments, the topmost dielectric layer (e.g., the seventh dielectric layer PM7) is in physical contact with the tape frame TP. Alternatively, the topmost dielectric layer (e.g., the seventh dielectric layer PM7) is spatially separated from the tape frame TP. In some embodiments, the step of attaching the structure to the tape frame TP is performed prior to the step of de-bonding the temporary carrier.

Figure 1D:
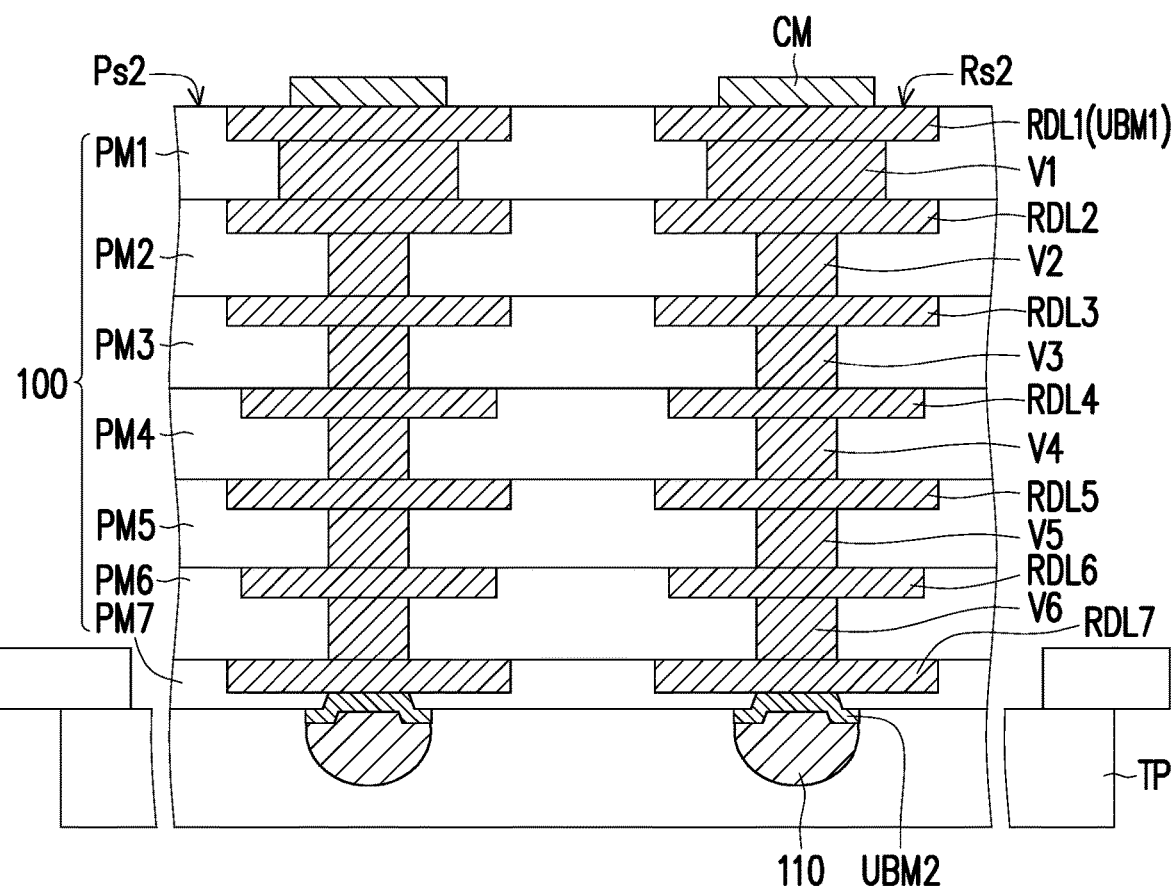
Figure 2D:
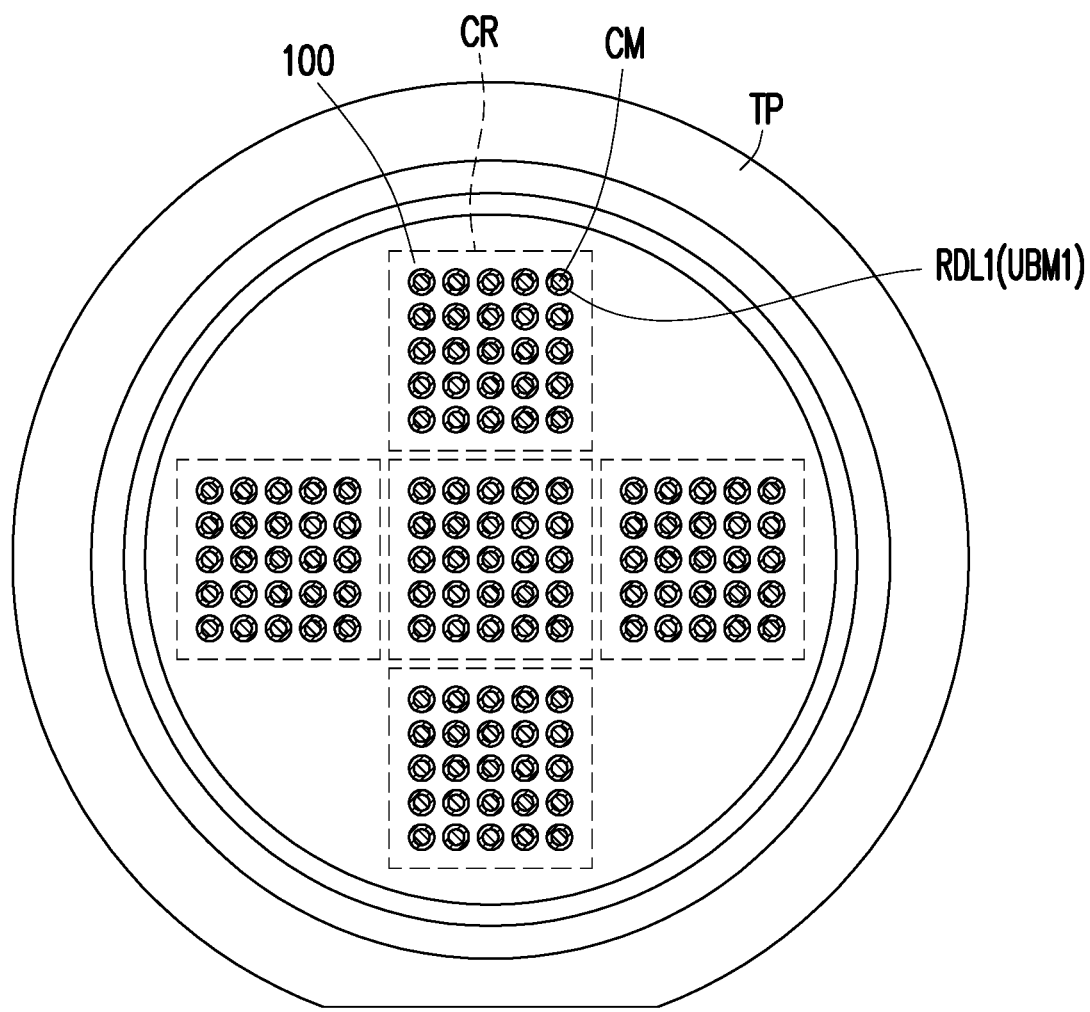

Referring to FIGS. 1D and 2D, a conductive material layer CM may be formed on the first conductive pattern RDL1 (i.e. the first UBM pattern UBM1) of the redistribution structure 100. In some embodiments, the conductive material layer CM is formed by printing, dispensing, or other suitable deposition techniques. For example, a stencil having apertures (not shown) is placed over the redistribution structure 100, where the apertures of the stencil may be aligned to the exposed surface Rs2 of the first conductive pattern RDL1. The apertures may be circular in shape, although through-holes in other stencils may have any shape, such as, oval, rectangular, and the like. After the stencil is placed, a conductive material may be then applied on the stencil and into the through holes of the stencil. In some embodiments, the conductive material is conductive paste including metal particles mixed with an adhesive. For example, the solder paste is utilized. Next, the stencil is removed, and the conductive material left on the exposed surface Rs2 of the first conductive pattern RDL1 forms the conductive material layer CM.

In some embodiments, the conductive material layer CM is solder flux applied to the first conductive pattern RDL1. The flux may serve primarily to aid the flow of the solder, such that the subsequently formed solder balls may make good contact with the first conductive pattern RDL1. The solder flux may be applied through brushing, spraying, printing, or the like. In some embodiments, the conductive material layer CM is formed on the first conductive pattern RDL1 (i.e. the first UBM pattern UBM1) within each of the circuit regions CR as shown in FIG. 2D. It is noted that the shape of the conductive material layer CM shown in FIGS. 1D and 2D is merely an example and construes no limitation in the disclosure.

Figure 1E:
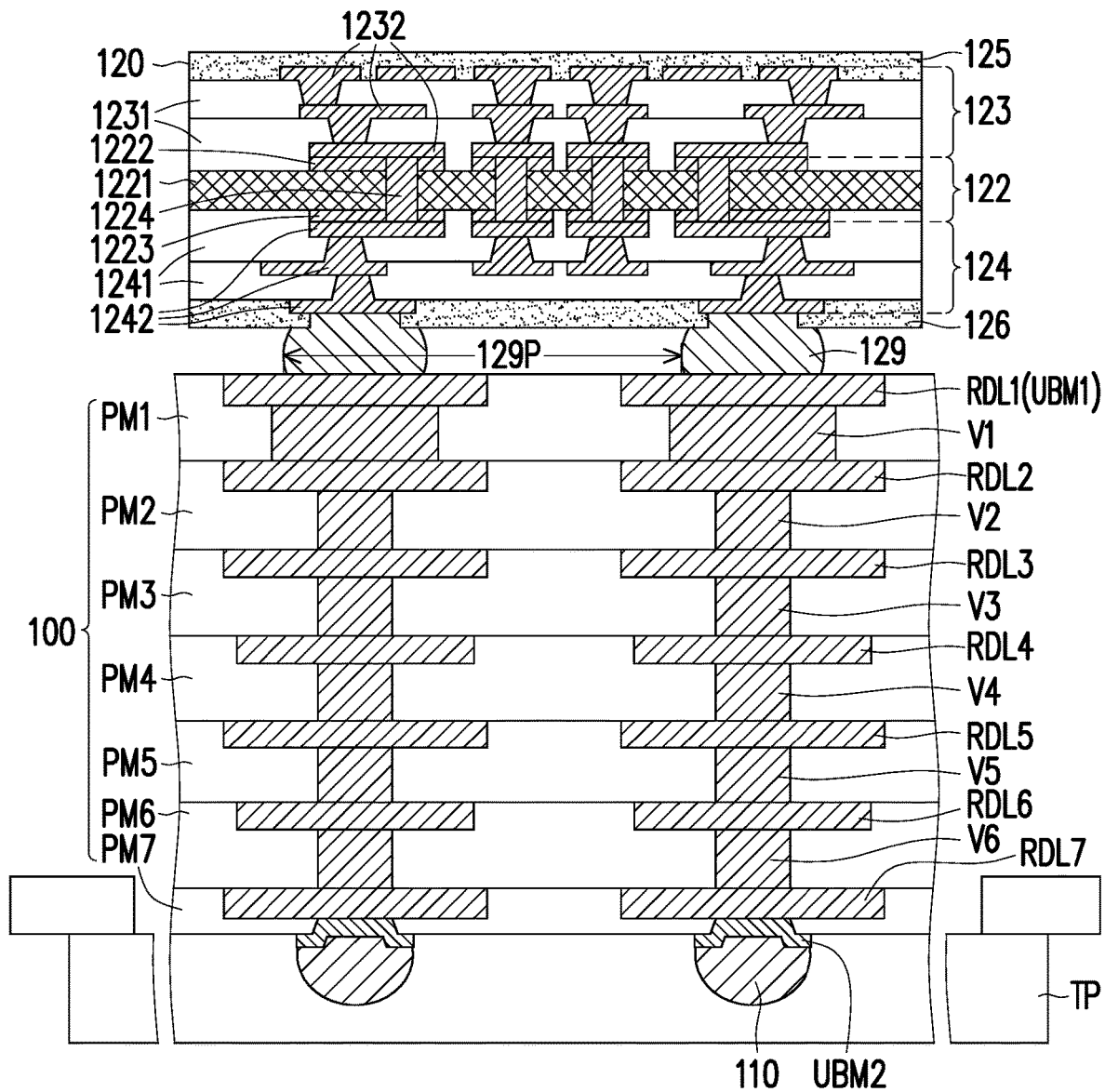
Figure 2E:
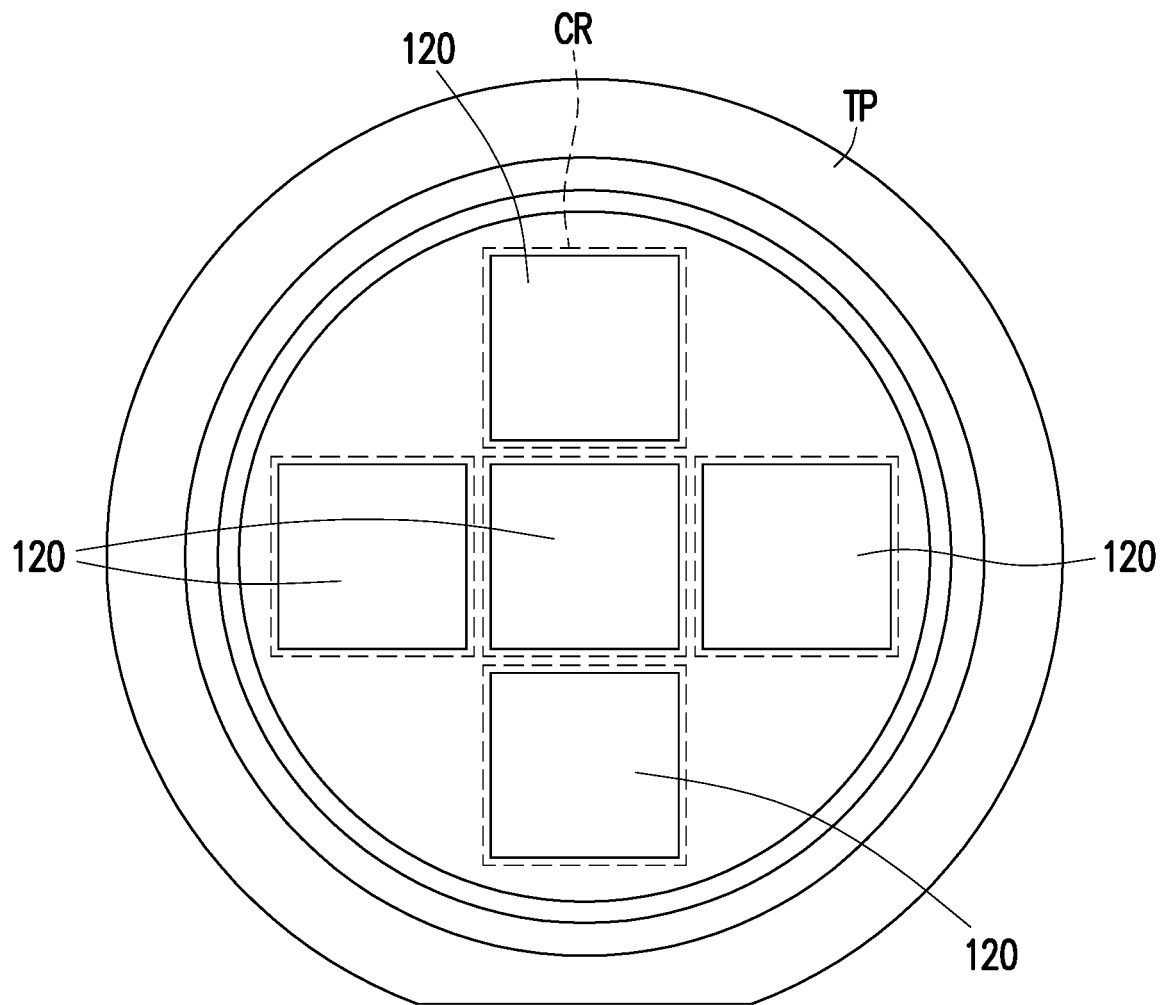

Referring to FIGS. 1E and 2E, a circuit substrate 120 is disposed over and coupled to the redistribution structure 100. For example, the circuit substrate 120 is placed into contact with the conductive material layer CM on the first conductive pattern RDL1 (i.e. the first UBM pattern UBM1), and then a high temperature process, such as reflow or thermal compression bonding, may be performed to melt the conductive material layer CM on the first conductive pattern RDL1 and/or the solder connectors (not shown) on the circuit substrate 120. The melted solder layer may thus join the circuit substrate 120 and the redistribution structure 100 together. In some embodiments, reflowed regions formed by melting the solder layer are referred to as conductive joints 129. The conductive joints 129 may be referred to as solder joints in accordance with some embodiments. In some embodiments, the critical dimension and the pitch 129P of adjacent conductive joints 129 are greater than the critical dimension and the pitch of adjacent conductive terminals 110. For example, the pitch 129P of the adjacent conductive joints 129 ranges from about 100 μm to about 1000 μm.

For example, at least one of the circuit substrate 120 is arranged within the respective circuit region CR as shown in FIG. 2E. In some embodiments, multiple circuit substrates 120 are disposed within the respective circuit region CR. It is noted that the size and the number of the circuit substrate 120 may be adjusted depending on product requirements and should construe no limitation in the disclosure. In some embodiments, the respective circuit substrate 120 includes a core layer 122, a first build-up layer 123 and a second build-up layer 124 disposed on two opposing sides of the core layer 122. In some embodiments, the core layer 122 includes a core dielectric layer 1221, a first core conductive layer 1222 and a second core conductive layer 1223 disposed on two opposing sides of the core dielectric layer 1221. The core dielectric layer 1221 may be or may include prepreg (e.g., containing epoxy, resin, and/or glass fiber), PI, a combination thereof, or the like. However, other dielectric materials may also be used. The materials of the first core conductive layer 1222 and the second core conductive layer 1223 may include copper, gold, tungsten, aluminum, silver, gold, a combination thereof, or the like. In some embodiments, the first core conductive layer 1222 and the second core conductive layer 1223 are copper foils coated or plated on the opposite sides of the core dielectric layer 1222. In some embodiments, a plurality of conductive through holes 1224 penetrating through the core layer 122 provide electrical paths between the electrical circuits located on the opposite sides of the core layer 122. The first build-up layer 1231 may be physically and electrically connected to the second build-up layer 1232 through the conductive through holes 1224.

In some embodiments, the first build-up layer 123 includes a plurality of first dielectric layers 1231 and a plurality of first conductive patterns 1232 alternately stacked over the first side of the core layer 122. The second build-up layer 124 may include a plurality of second dielectric layers 1241 and a plurality of second conductive patterns 1242 alternately stacked over the second side of the core layer 122. The via portions of the first conductive patterns 1232 and the via portions of the second conductive patterns 1242 may be tapered toward the core layer 122. Although only two layers of conductive patterns and two layers of dielectric layers are illustrated for each of the first build-up layer 123 and the second build-up layer 124, the scope of the disclosure is not limited thereto. The materials of the first and second dielectric layers 1231 and 1241 may be or may include prepreg, PI, PBO, BCB, silicon nitride, silicon oxide, phosphosilicate glass (PSG), borosilicate glass (BSG), boron-doped phosphosilicate glass (BPSG), a combination thereof, or the like. In some embodiments, the materials of the first and second conductive patterns 1232 and 1242 may be or may include metal, such as aluminum, titanium, copper, nickel, tungsten, and/or alloys thereof.

In some embodiments, the circuit substrate 120 includes a first mask layer 125 disposed on the outermost one of the first dielectric layer 1231 to cover the first conductive patterns 1232, and a second mask layer 126 disposed on the outermost one of the second dielectric layer 1241 to cover the second conductive patterns 1242. The second mask layer 126 may include a plurality of openings that partially expose the outermost one of the second conductive pattern 1242. In some embodiments, the first mask layer 125 may also include openings (not shown) that partially expose the outermost one of the first conductive pattern 1232 for further electrical connection. In some embodiments, the materials of the first and second mask layers 125 and 126 may be or may include a chemical composition of silica, barium sulfate and epoxy resin, and/or the like. The first and second mask layers 125 and 126 may serve as solder masks and may be selected to prevent short, corrosion or contamination of the circuit pattern and protect circuits of the circuit substrate 120 from external impacts and chemicals. In some embodiments, the conductive joints 129 are disposed in the openings of the second mask layer 126 to be in physical and electrical contact with the second conductive pattern 1242. Alternatively, the first mask layer 125 and/or the second mask layer 126 may be omitted.

In some embodiments, the circuit substrate 120 may be or may include a printed circuit board (PCB) such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized, and all such redistributive substrates that provide support and connectivity to the redistribution structure 100 are fully intended to be included within the scope of the embodiments. Variations of the circuit substrate 120 will be described later in other embodiments.

Figure 1F:
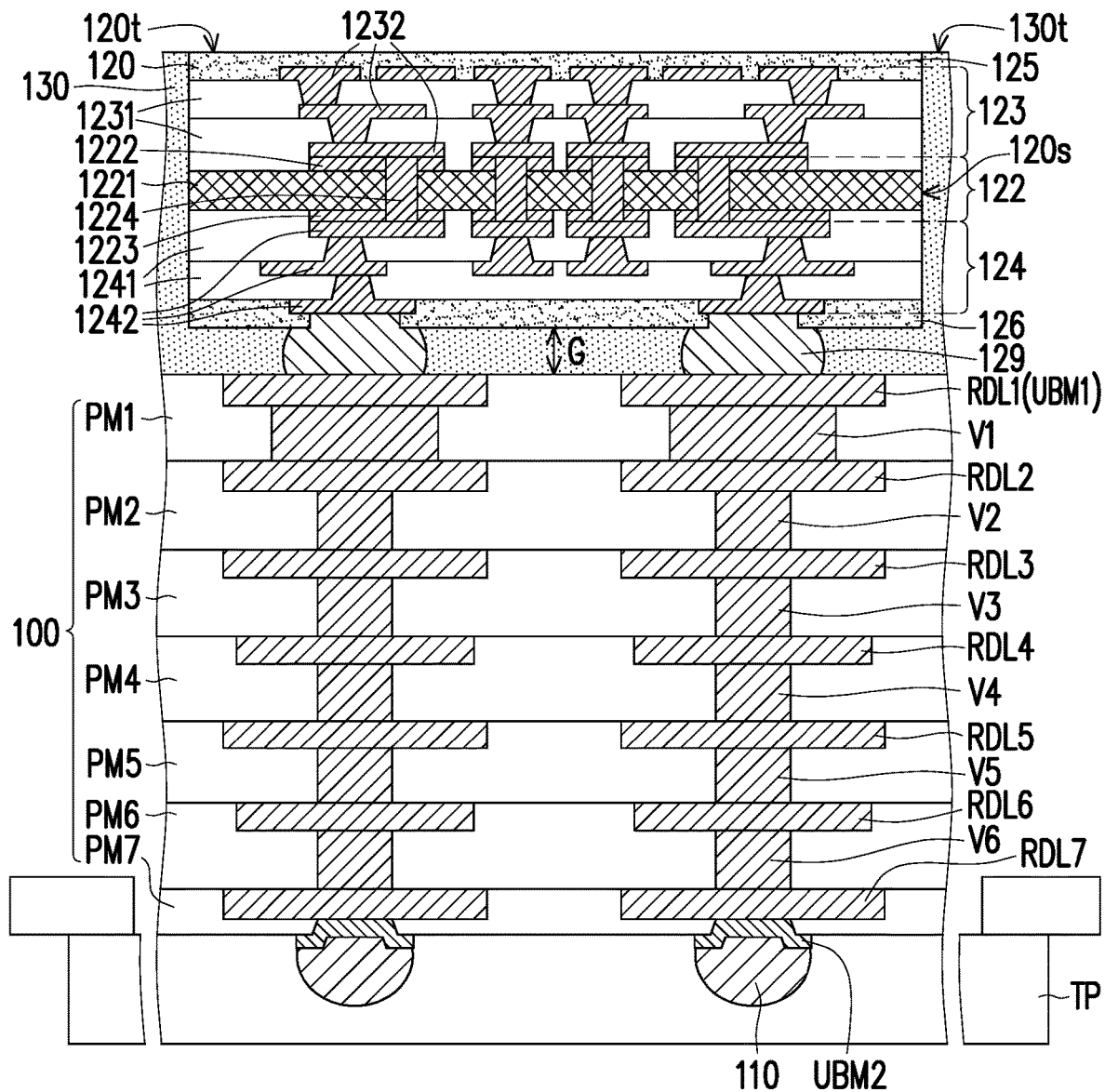
Figure 2F:
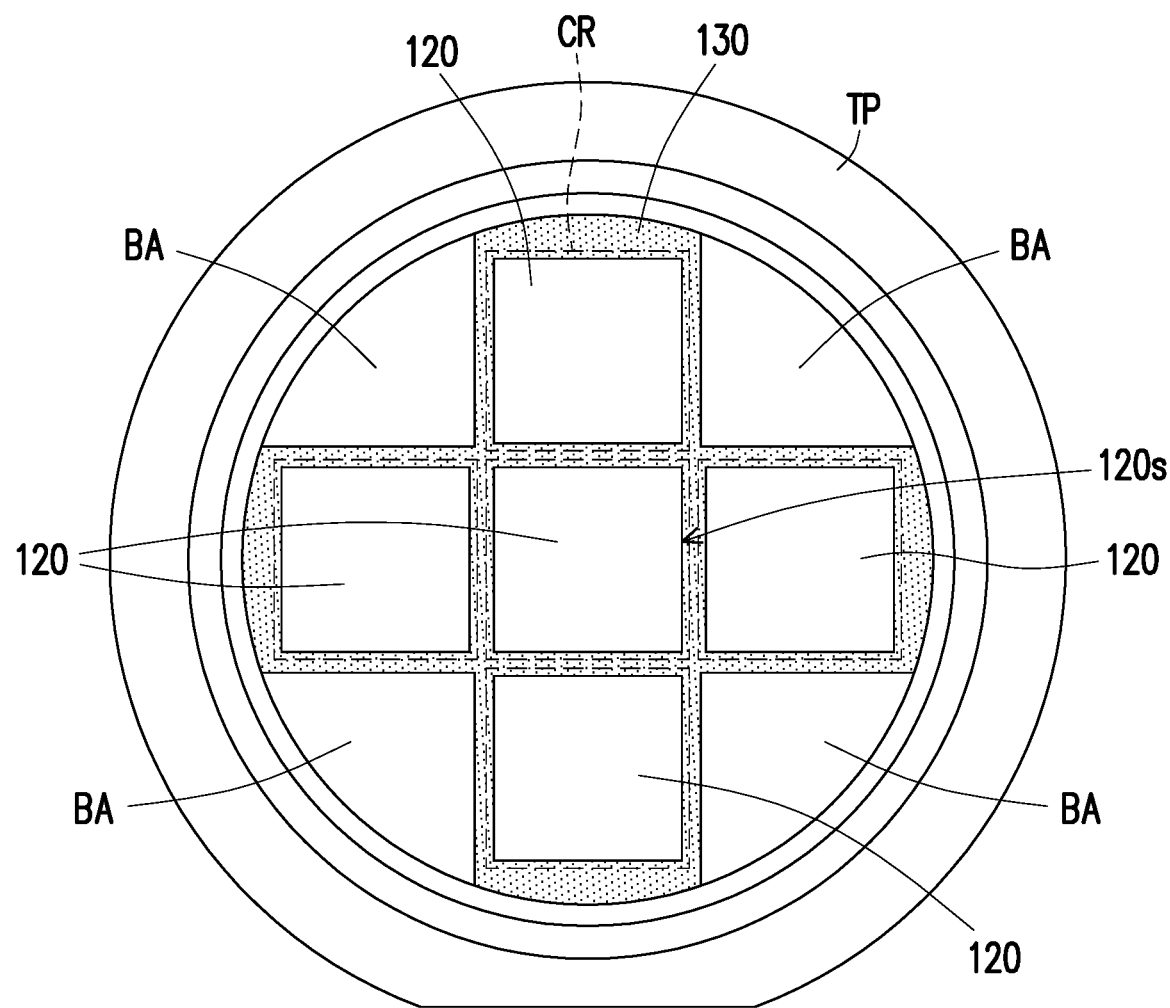

Referring to FIGS. 1F and 2F, an insulating encapsulation 130 is formed on the redistribution structure 100 to cover the circuit substrate 120. The material of the insulating encapsulation 130 may be or may include a molding compound, an epoxy, a resin, a dispensed molding underfill (DMUF), or a combination thereof, or the like. The insulating encapsulation 130 may be dispensed using such as a molding process (e.g., a transfer molding process), an injection process, a combination thereof, or the like. In some embodiments, the formation of the insulating encapsulation 130 includes at least the following steps. A molding chase (not shown) may be disposed over the redistribution structure 100, where the circuit substrates 120 are accommodated in the space defined by the molding chase. For example, blank areas BA, where no circuit region CR is arranged, may be blocked by the molding chase. The insulating material may be injected into the space and spread to mold the circuit substrates 120. Since the blank areas BA are masked by the molding chase, the insulating material may be confined within the space. Thus, no insulating material is formed in the blank areas BA. In such embodiments, less amount of the insulating material can be applied. It is noted that the blank areas shown in FIG. 2F are merely embodiments that are schematically illustrated, and the molding chase may block other regions besides the circuit regions. Alternatively, the blank areas BA are not covered by the molding chase, and after the molding process, the insulating material covers the circuit substrates 120 and also spreads in the blank areas BA. In some embodiments, the insulating material may be dispensed into the gaps G between the second mask layer 126 of the circuit substrate 120 and the first dielectric layer PM1 of the redistribution structure 100 in the cross-sectional view. Next, the insulating material may be cured. After the curing, the molding chase may be removed, and the insulating encapsulation 130 is formed on the redistribution structure 100 to encapsulate the circuit substrates 120 and the conductive joints 129.

For example, the insulating encapsulation 130 may laterally cover the conductive joints 129 for protection. In some embodiments in which the first dielectric layer PM1 is substantially leveled with the first conductive pattern RDL1 (i.e. the first UBM pattern UBM1), the insulating encapsulation 130 is disposed on the first dielectric layer PM1 and may further extend to cover the portion of the first conductive pattern RDL1 on which the conductive joints 129 are not formed. In some embodiments, the insulating encapsulation 130 is formed between neighboring circuit substrates 120 and extends along the sidewalls 120s of the respective circuit substrate 120. In some embodiments, the top surface 130t of the insulating encapsulation 130 is substantially leveled with the top surfaces 120t of the circuit substrates 120. For example, a planarization process (e.g., CMP, grinding, etching, combinations of these, etc.) is performed to level the insulating encapsulation 130 and the circuit substrates 120. In other embodiments, the planarization process is omitted. The insulating encapsulation 130 may partially cover the sidewalls 120s of the circuit substrate 120. In some embodiments, the insulating encapsulation 130 may be rigid enough to provide structural support for the structure. In some embodiments, an underfill layer (not shown) is formed to cover the conductive joints 129 prior to forming the insulating encapsulation 130. The detailed descriptions of the underfill layer will be described later in accompany with FIGS. 3D-3G.

Figure 1G:
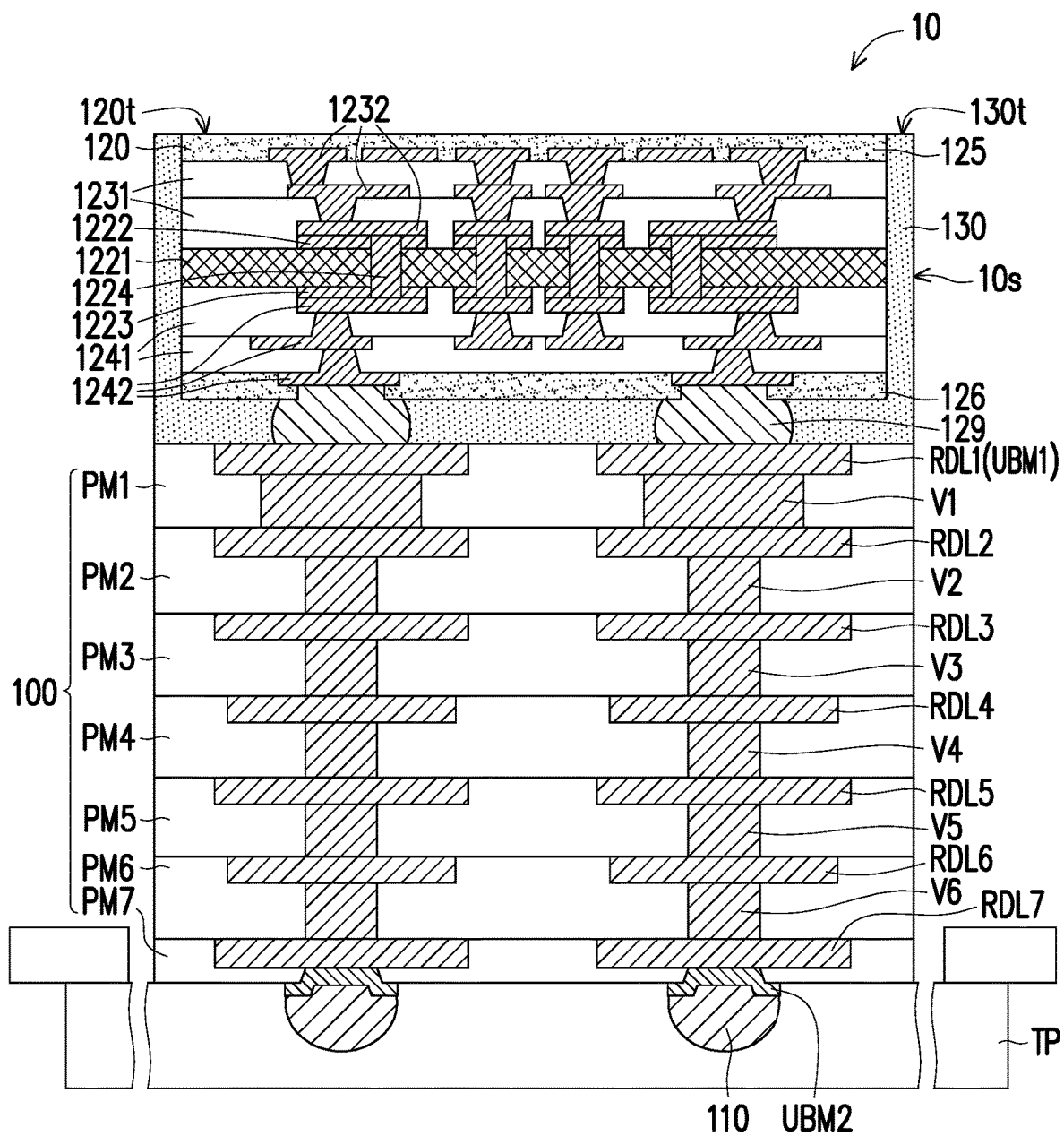
Figure 2G:
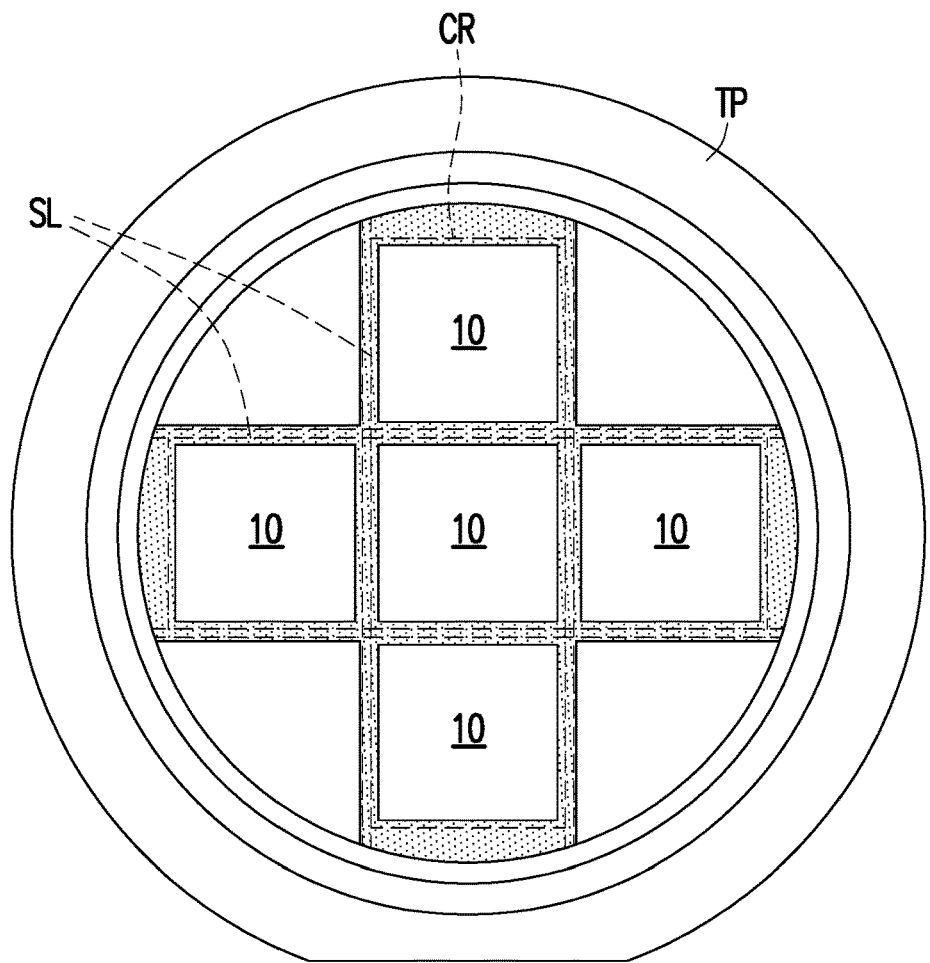

Referring to FIGS. 1G and 2G, a singulation process may be performed to separate the structure into a plurality of semiconductor structures 10. The singulation process may be performed using any suitable dicing tool (e.g., a blade, a saw, a laser drill, an etching process, combinations thereof, etc.) to cut through and/or remove materials of the different layers of the structure. For example, the dicing tool may cut along scribe lines SL to separate the circuit regions CR so as to form the semiconductor structures 10. In some embodiments, the insulating encapsulation 130 and the underlying redistribution structure 100 are cut through to form substantially coterminous sidewalls 10s of the semiconductor structure 10.

Figure 1H:
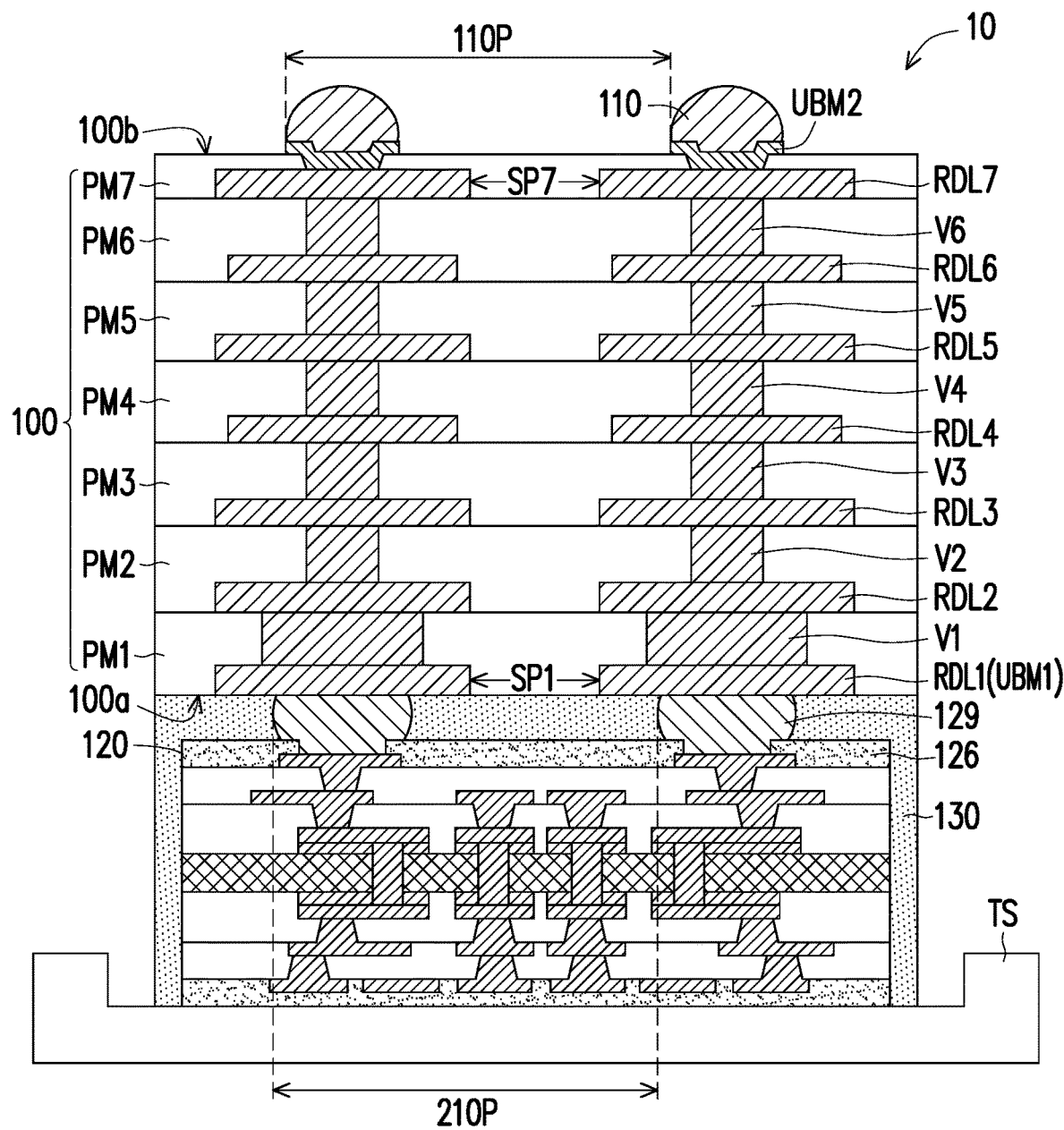
Figure 2H:
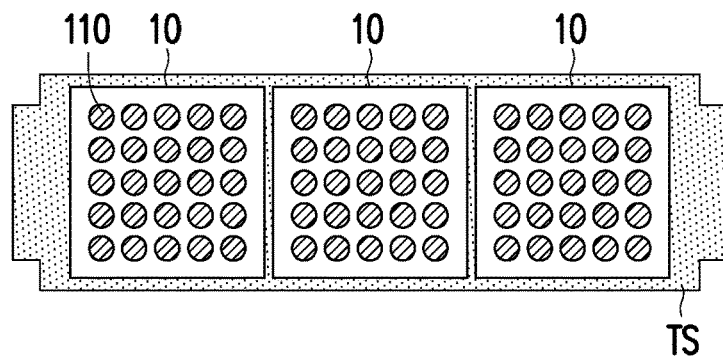

Referring to FIGS. 1H and 2H and also with reference to FIG. 1G, after the singulation process, the semiconductor structures 10 are separated from the tape frame TP and then placed on a tray cassette TS. The semiconductor structures 10 on the tray cassette TS may await to transfer to the next station or may ship to customers. As shown in FIG. 1H, the respective semiconductor structure 10 includes the redistribution structure 100, the circuit substrate 120 disposed on a first side 100a of the redistribution structure 100, the conductive terminals 110 distributed on a second side 100b of the redistribution structure 100 opposite to the first side 100a, the insulating encapsulation 130 disposed on the first side 100a of the redistribution structure 100 to at least laterally cover the circuit substrate 120. The circuit substrate 120 is electrically connected to the redistribution structure 100 through the conductive joints 129, and the conductive joints 129 are formed on the first conductive pattern RDL1

(i.e. the first UBM pattern UBM1). The conductive terminals 110 may be electrically coupled to the circuit substrate 120 through the redistribution structure 100.

In some embodiments, the first conductive pattern RDL1 (i.e. the first UBM pattern UBM1) is substantially flush with the first dielectric layer PM1. In some embodiments, a critical dimension of the conductive features in the redistribution structure 100 close to the first side 100a is greater than that of the conductive features in the redistribution structure 100 away from the first side 100a (or close to the second side 100b). For example, the spacing SP1 of the first conductive pattern RDL1 close to the first side 100a of the redistribution structure 100 is greater than the spacing SP7 of the seventh conductive pattern RDL7 close to the second side 100b of the redistribution structure 100. The critical dimension of the first conductive via V1 close to the first side 100a of the redistribution structure 100 may be greater than the critical dimension of the sixth conductive via V6 close to the second side 100b of the redistribution structure 100. In some embodiments, the pitch 110P of the adjacent conductive terminals 110 is less than the pitch 129P of the adjacent conductive joints 129. The critical dimension of the respective conductive terminal 110 may be less than that of the respective conductive joint 129.

In some embodiments, since the conductive terminals 110 are formed on the redistribution structure 100 prior to mounting the circuit substrate 120 on the redistribution structure 100, a laser drilling process and a ball placement process may be omitted to simplify the manufacturing steps. The warpage of the semiconductor structure 10 may be reduced by omitting the steps of laser drilling and/or ball placement. In some embodiments, since the blank areas (see FIG. 2F) are blocked by the molding chase, the dummy substrate is unnecessary to be placed on these blank areas for blocking, and the amount of the insulating material that is used to form the insulating encapsulation 130 may be reduced. The manufacturing method described above may meet the requirements of lower process costs and prevention of cracking issue causing by high warpage degrees.

FIGS. 3A-3G are schematic cross-sectional views of various stages of manufacturing a semiconductor structure in accordance with some embodiments, and FIGS. 4A-4G are schematic top views corresponding to FIGS. 3A-3G in accordance with some embodiments. Unless specified otherwise, the materials and the formation methods of the components described herein are essentially the same as the like components, which are denoted by like reference numerals shown in FIGS. 1H-2H.

Figure 3A:
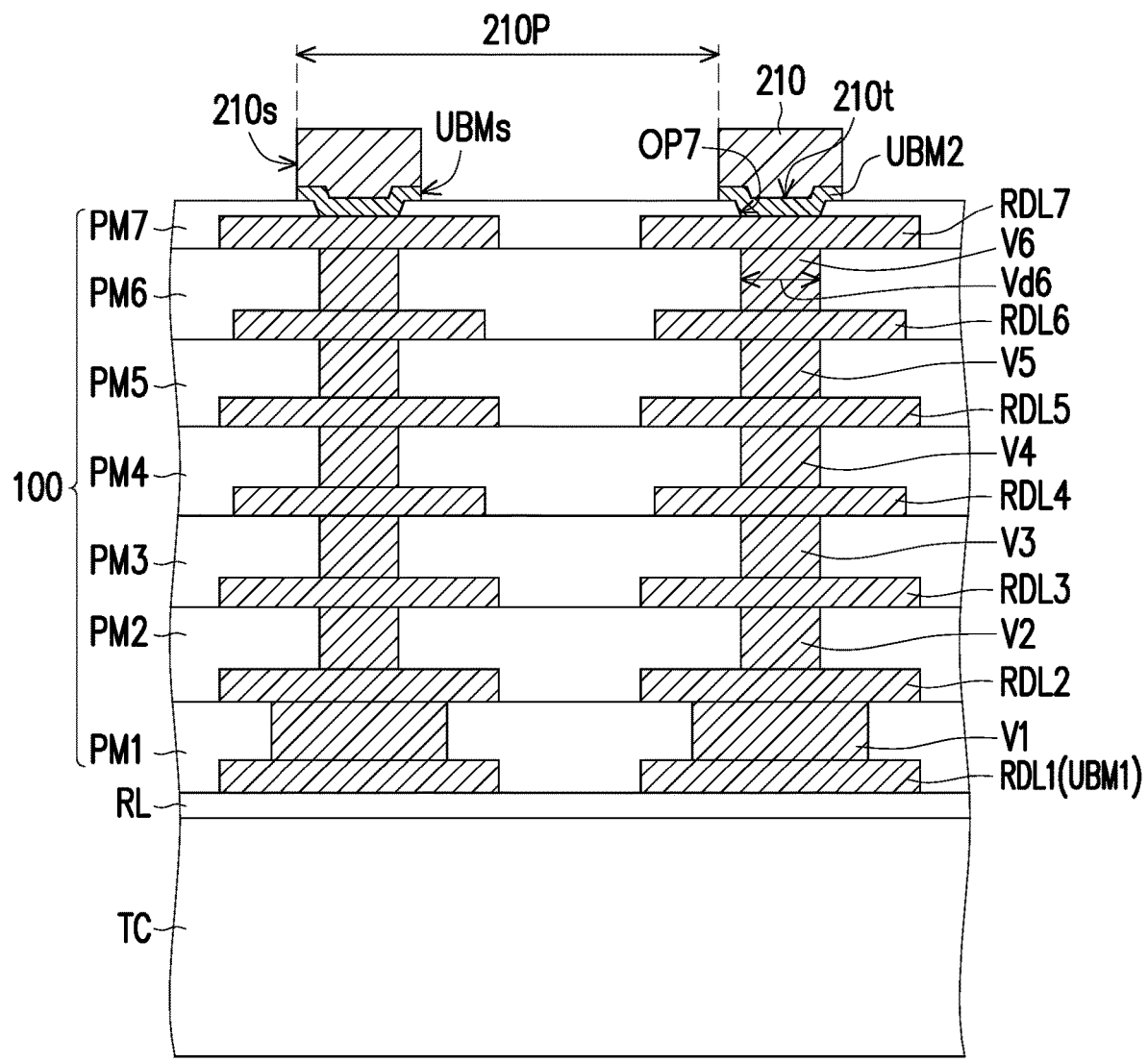
FIGS. 3A-3G are schematic cross-sectional views of various stages of manufacturing a semiconductor structure in accordance with some embodiments.
Figure 4A:
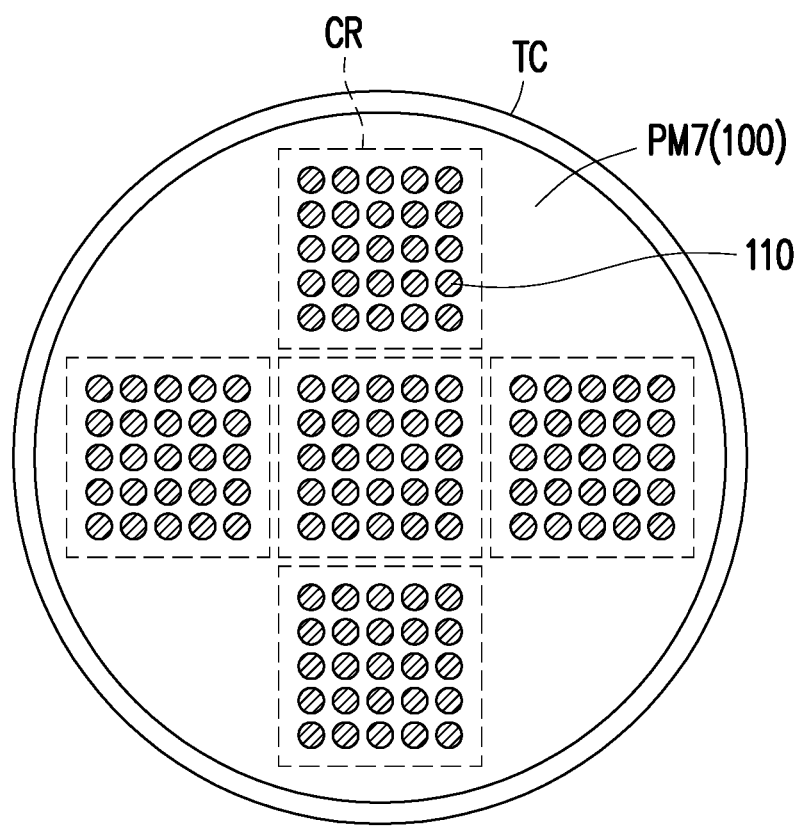
FIGS. 4A-4G are schematic top views corresponding to FIGS. 3A-3G in accordance with some embodiments.

Referring to FIGS. 3A and 4A, the redistribution structure 100 is formed over the temporary carrier TC, and a plurality of conductive terminals 210 may be formed on the redistribution structure 100. In some embodiments, the redistribution structure 100 including the conductive patterns (e.g., RDL1-RDL7), the conductive vias (e.g., V1-V6), and dielectric layers (e.g., PM1-PM7) is formed over the temporary carrier TC, and then the second UBM pattern UBM2 is formed in the openings OP7 of the topmost dielectric layer (e.g., the seventh dielectric layer PM7), and the conductive terminals 210 are then formed on the second UBM pattern UBM2. The details regarding the formation process and the materials of the redistribution structure 100 and the second UBM pattern UBM2 may be found in the discussion of the embodiments shown in FIGS. 1A and 2A, so the detailed descriptions are not repeated for the sake of brevity.

In some embodiments, the respective conductive terminal 210 includes a pre-solder layer and a solder layer formed on the pre-solder layer. For example, a pre-solder layer is formed on the second UBM pattern UBM2 by plating, sputtering, printing, CVD, or other depositions. The pre-solder layer may be formed of eutectic materials such as an alloy including tin and lead, and/or the like. A solder layer may then be formed by plating, where during the plating the pre-solder layer may serve as a seed layer. The solder layer may be a lead based solder such as Pb or Pb/Sn, a lead free solder such as Sn, Sn/Ag, Sn/Ag/Cu, or other eutectic materials used as lead free solder. The pre-solder layer and the solder layer are optionally subjected to a reflow process to form the conductive terminal 210. In some embodiments, before forming the pre-solder layer, a mask layer (e.g., photoresist) is formed and patterned, so that portions of the second UBM pattern UBM2 are exposed. Next, the pre-solder layer and the solder layer may be plated in the openings of the mask layer and over the second UBM pattern UBM2. Subsequently, the mask layer is removed.

In some embodiments, the conductive terminals 210 are formed of non-reflowable materials that do not melt under the melting temperature of solder material. Under this scenario, the sidewalls of the conductive terminals 210 may remain to be substantially vertical after the reflow process. In some embodiments, the sidewalls 210s of the conductive terminals 210 may be substantially leveled with the sidewalls UBMs of the underlying second UBM pattern UBM2 on the top surface of the outermost one of the dielectric layers (e.g., the seventh dielectric layer PM7). In some embodiments, the respective conductive terminal 210 has a substantially planar top surface 210t connected to the sidewalls 210s. Alternatively, the conductive terminals 210 have rounded top surfaces after the reflow process. Other methods for forming the conductive terminals 210 may be used. For example, a pitch 210P of the adjacent conductive terminals 210 is less than 130 μm. In some embodiments, the pitch 210P of the adjacent conductive terminals 210 is less than 10 μm. It is noted that the pitches 210P of the conductive terminals 210 may be adjusted depending on I/O connectors of a semiconductor device (e.g., the semiconductor device 500 shown in FIG. 11) that is to be mounted thereon.

Figure 3B:
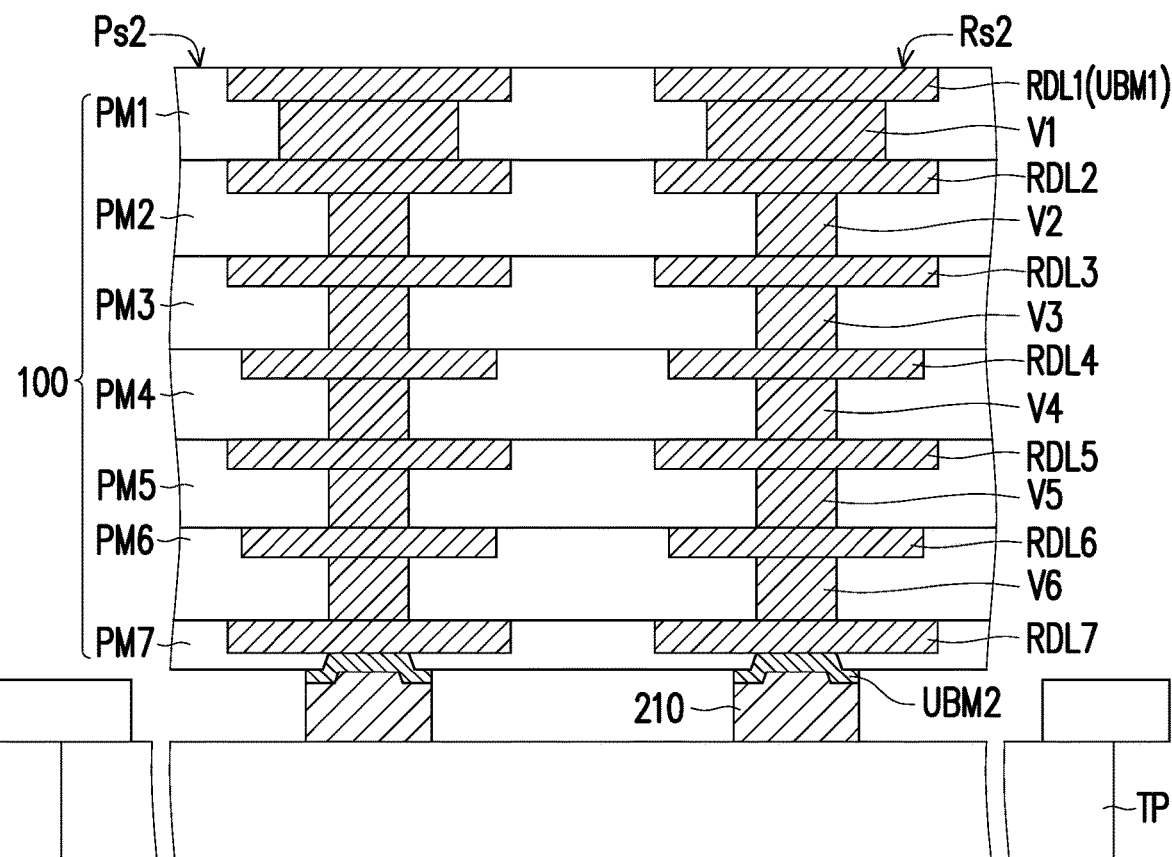
Figure 4B:
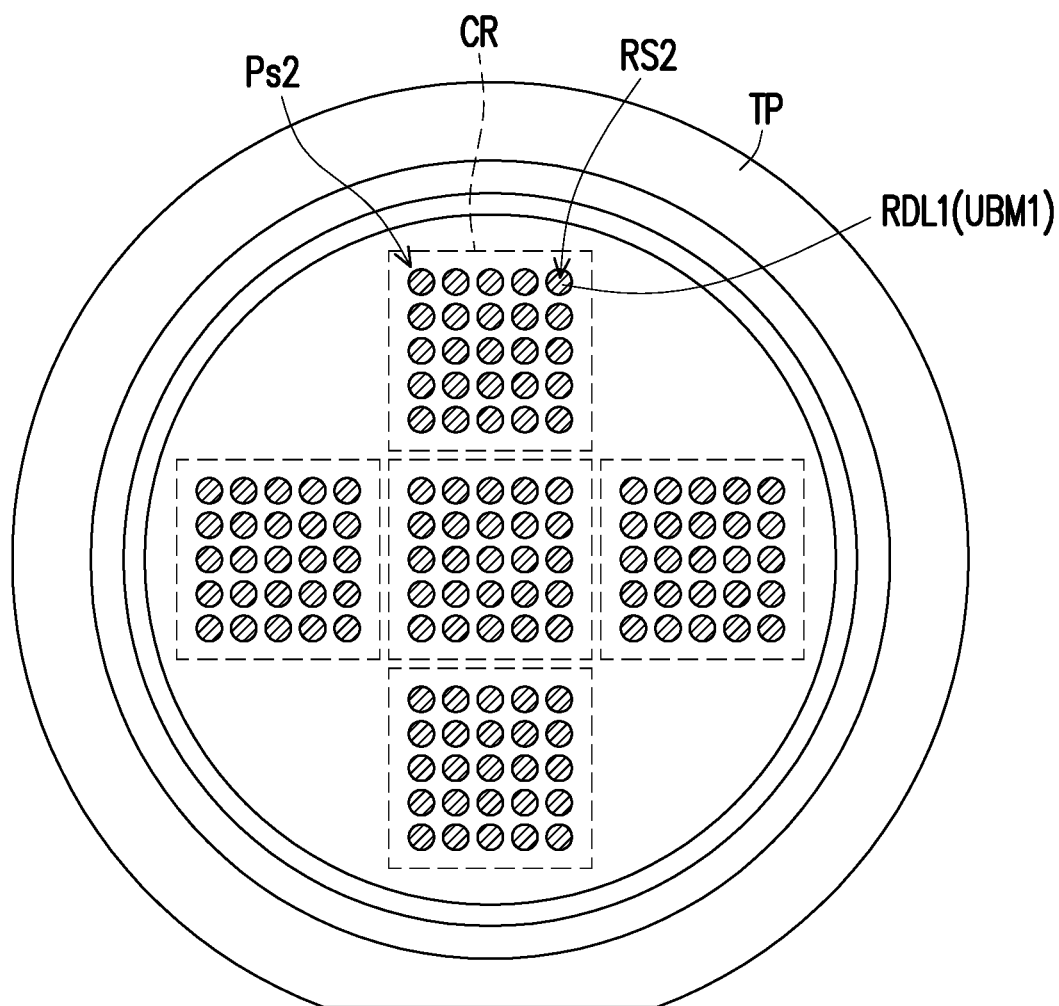

Referring to FIGS. 3B and 4B and also with reference to FIG. 3A, the temporary carrier TC may be removed, and the redistribution structure 100 may be placed on the tape frame TP. For example, the first dielectric layer PM1 and the first conductive pattern RDL1 (i.e. the first UBM pattern UBM1) are exposed after removing the temporary carrier TC. In some embodiments, the exposed surface Ps2 of the first dielectric layer PM1 is substantially flush with the exposed surface Rs2 of the first conductive pattern RDL1. In some embodiments, after de-bonding the temporary carrier TC, the resulting structure is overturned to be placed on the tape frame TP. For example, the conductive terminals 210 are attached to the tape frame, and the first dielectric layer PM1 and the first conductive pattern RDL1 of the redistribution structure 100 may face outwardly for further processing. In some embodiments, the redistribution structure 100 (e.g., the seventh dielectric layer PM7) is in contact with the tape frame TP after placement or during the subsequent processing. In some embodiments, the redistribution structure 100 (e.g., the seventh dielectric layer PM7) is spaced apart from the tape frame TP. The de-bonding process of the temporary carrier TC and the placement process of the structure on the tape frame TP may be similar to the processes described in FIGS. 1C and 2C, so the detailed descriptions are not repeated for simplicity.

Figure 3C:
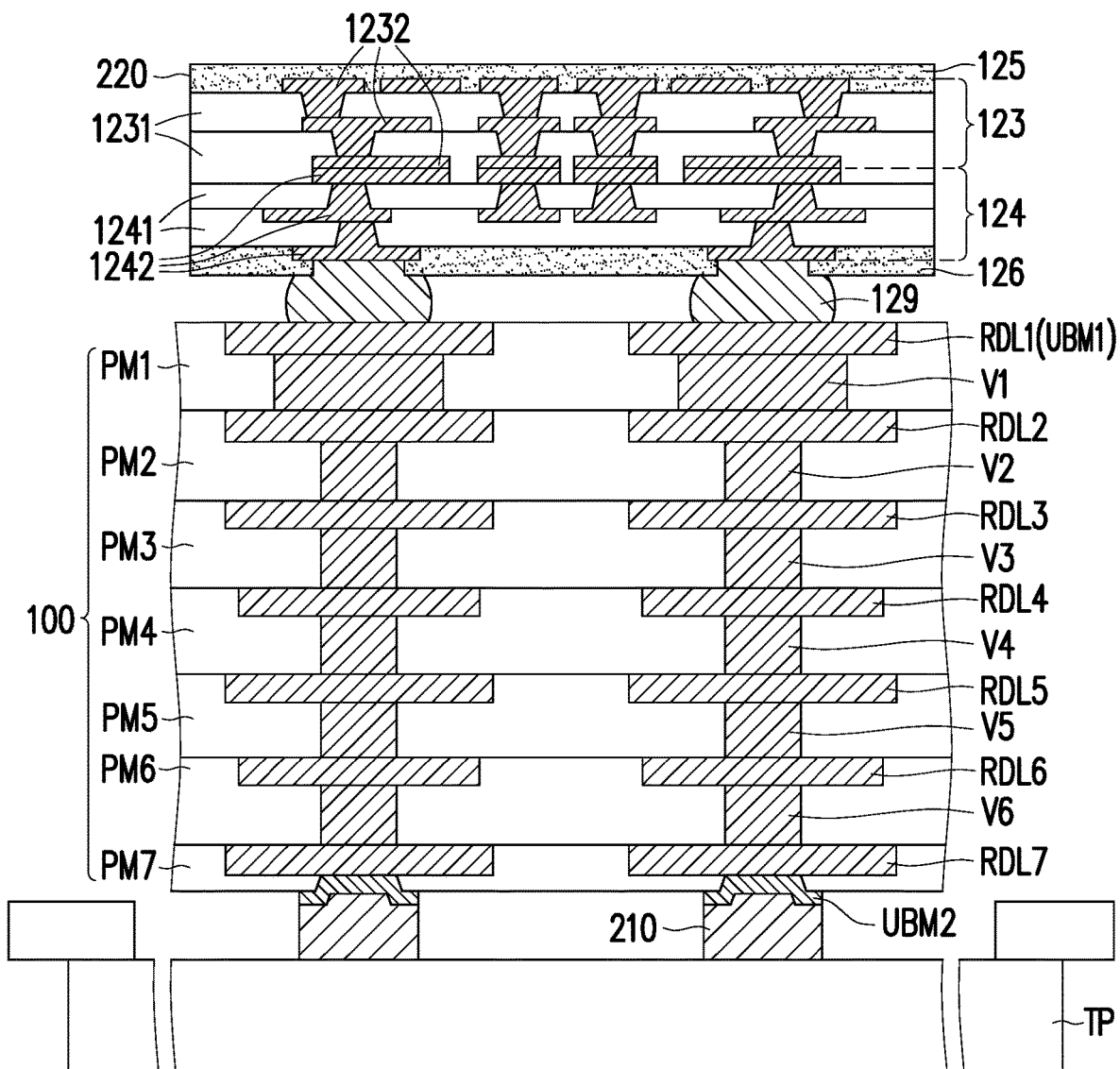
Figure 4C:
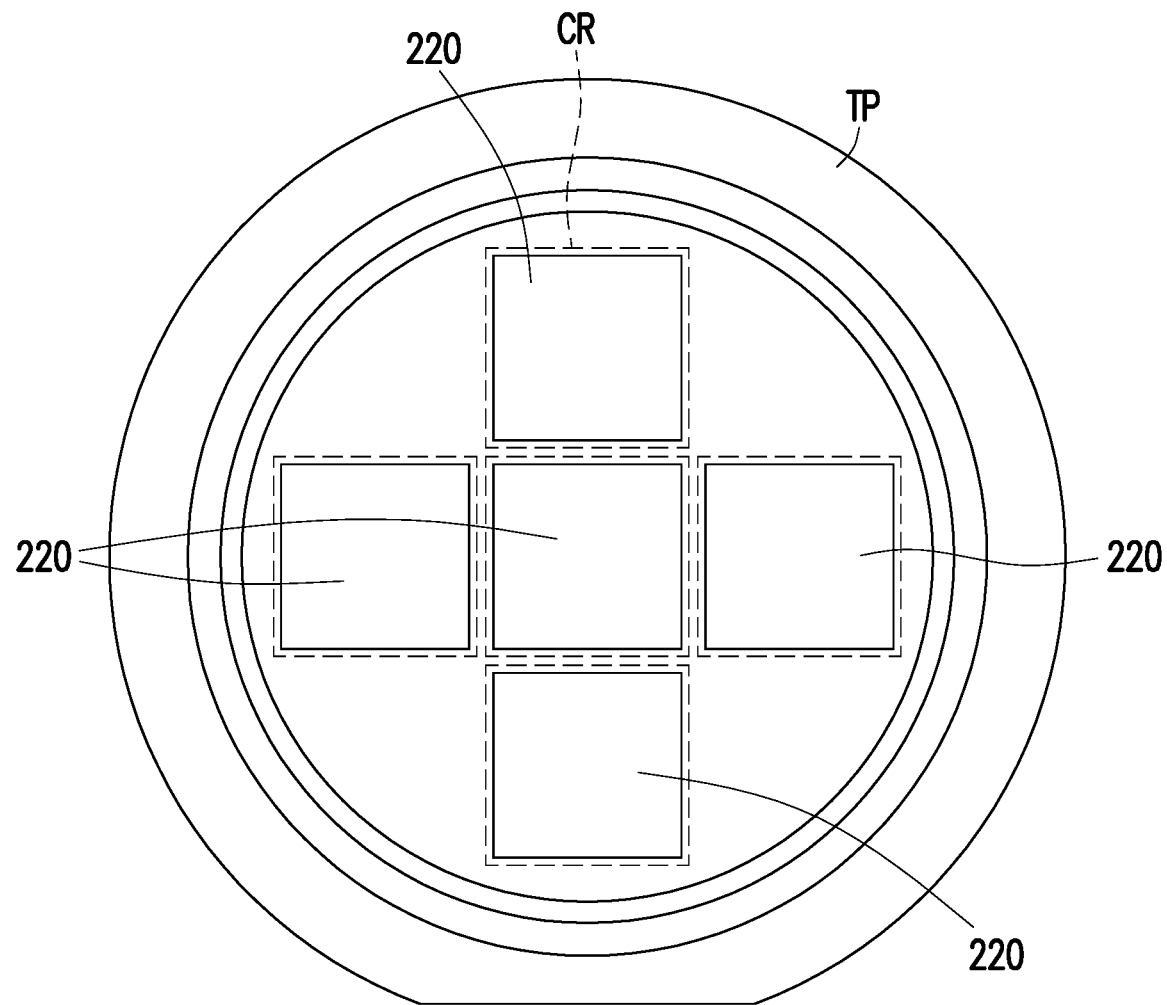

Referring to FIGS. 3C and 4C, a circuit substrate 220 are coupled to the redistribution structure 100. The mounting process of the circuit substrate 220 may be similar to the mounting process of the circuit substrate 120 described in FIGS. 1D-1E and 2D-2E, so the detailed descriptions are simplified for the sake of brevity. For example, the conductive material layer is formed on the first conductive pattern RDL1 of the redistribution structure 100, and then the circuit substrate 220 is placed into contact with the conductive material layer through a pick-and-place process. Subsequently, the reflow process may be performed to form the conductive joints 129 coupling the circuit substrate 220 to the redistribution structure 100. In some embodiments, one of the circuit substrates 220 is disposed on each circuit region CR as shown in FIG. 4C. In some other embodiments, multiple circuit substrates 220 are disposed within each of the circuit regions CR.

In some embodiments, the circuit substrate 220 is a coreless circuit board. For example, the circuit substrate 220 is similar to the circuit substrate 120 described in FIG. 1E, except that the circuit substrate 220 is formed without the core layer. In some embodiments, the circuit substrate 220 includes the first build-up layer 123 and the second build-up layer 124 stacked upon one another. In some embodiments, the first dielectric layers 1231 and the first conductive patterns 1232 of the first build-up layer 123 are alternately stacked. The second dielectric layers 1241 and the second conductive patterns 1242 of the second build-up layer 124 may be alternately stacked, where the topmost one of the second conductive patterns 1242 is physically and electrically connected to the bottommost one of the first conductive patterns 1232, and the bottommost one of the first dielectric layers 1231 is overlaid the topmost one of the second dielectric layers 1241. In some embodiments, the via portions of the first conductive patterns 1232 are tapered toward the second build-up layer 124, and the via portions of the second conductive patterns 1242 may be tapered toward the first build-up layer 123. Although only two layers of conductive patterns and two layers of dielectric layers are illustrated for each of the first build-up layer 123 and the second build-up layer 124, the scope of the disclosure is not limited thereto.

In some embodiments, the first mask layer 125 of the circuit substrate 220 is disposed on the outermost one of the first dielectric layer 1231 to cover the first conductive patterns 1232, and the second mask layer 126 may be disposed on the outermost one of the second dielectric layer 1241 to cover the second conductive patterns 1242. In some embodiments, the conductive joints 129 are disposed in the openings of the second mask layer 126 to be in physical and electrical contact with the second conductive pattern 1242. In some embodiments, the first mask layer 125 may also include openings (not shown) that partially expose the outermost one of the first conductive pattern 1232 for further electrical connection. It is noted that the circuit substrate shown in FIG. 3C is merely an example, and the circuit substrate 220 may be replaced with the circuit substrate 120 or may include additional elements or fewer elements.

Figure 3D:
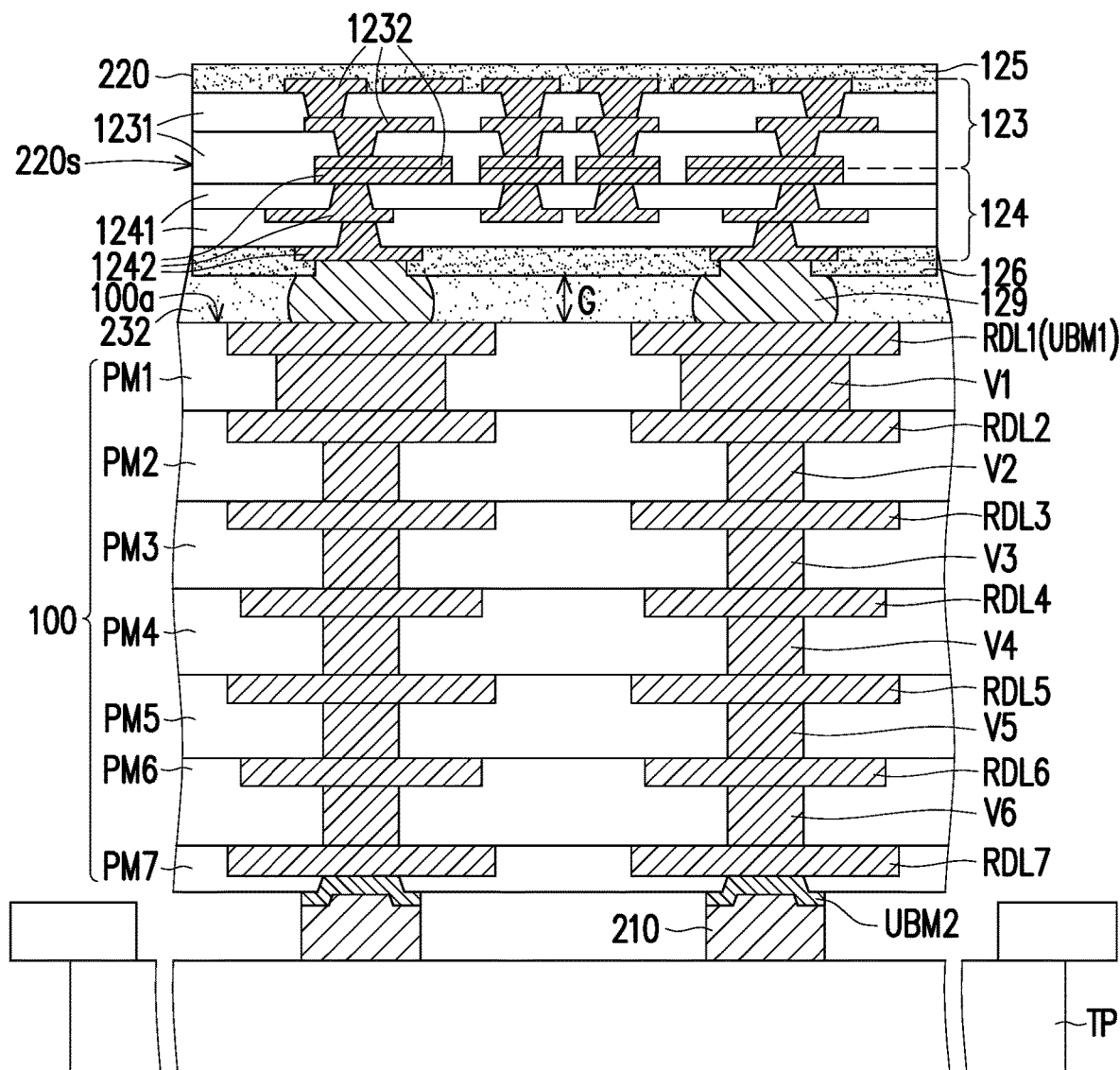
Figure 4D:
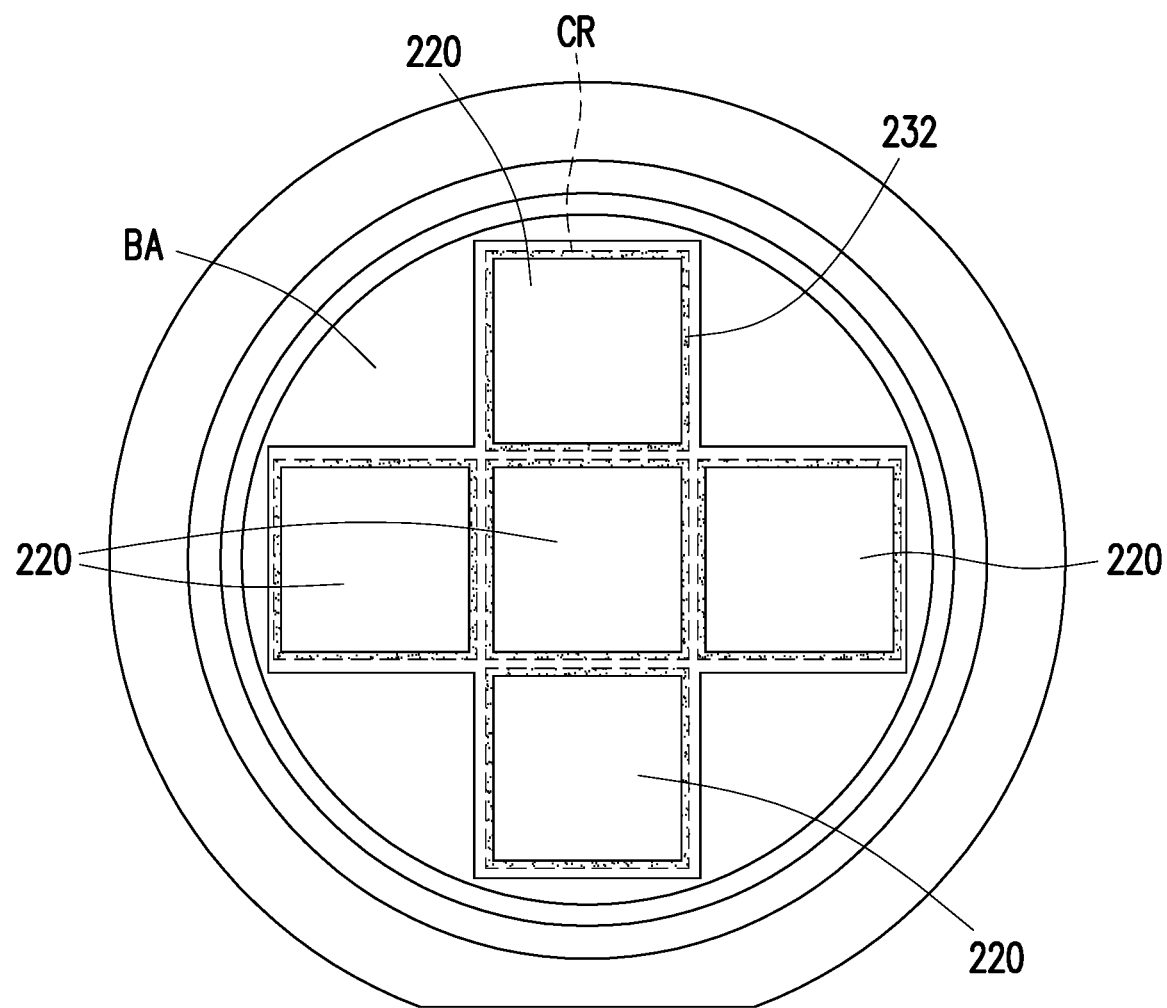

Referring to FIGS. 3D and 4D, an underfill layer 232 may be formed on the redistribution structure 100 to surround the conductive joints 129. For example, the underfill layer 232 is formed on the first dielectric layer PM1 by a capillary flow process after the circuit substrate 220 is mounted on the redistribution structure 100. Other method (e.g., a molding process, an injection process, combinations of these, or the like) may be used. In some other embodiments, the underfill layer 232 may be formed by a suitable deposition method before the circuit substrate 220 is mounted. The underfill layer 232 may be or may include a mold underfill, a polymer underfill, a dispensed molding underfill, a resin, or the like.

In some embodiments, a liquid epoxy is dispensed between the gap G between the first side 100*a* of the redistribution structure 100 and the second mask layer 126 of the circuit substrate 220, and then the liquid epoxy is cured to harden. The underfill layer 232 may provide a certain degree of protection to the conductive joints 129.

In some embodiments, a sufficient amount of the underfill layer 232 is deposited on the first dielectric layer PM1 of the redistribution structure 100. The underfill layer 232 may cover the conductive joints 129 and the first conductive pattern RDL1 (i.e. the first UBM pattern UBM1) exposed by the first dielectric layer PM1. In some embodiments, a portion of the underfill layer 232 extends beyond the gap G and climbs up to cover at least a portion of the sidewalls 220*s* of the circuit substrate 220. In some embodiments, the underfill layer 232 spreads within the respective circuit region CR in the top-down view. In some other embodiments, the underfill layer 232 extends beyond the area defined by the respective circuit region CR. In the top-down view, the underfill layer 232 formed in each circuit region CR may be separated from one another or may be completely or partially linked together, depending on how much the amount of the material is deposited. In other embodiments, no underfill layer is formed.

Figure 3E:
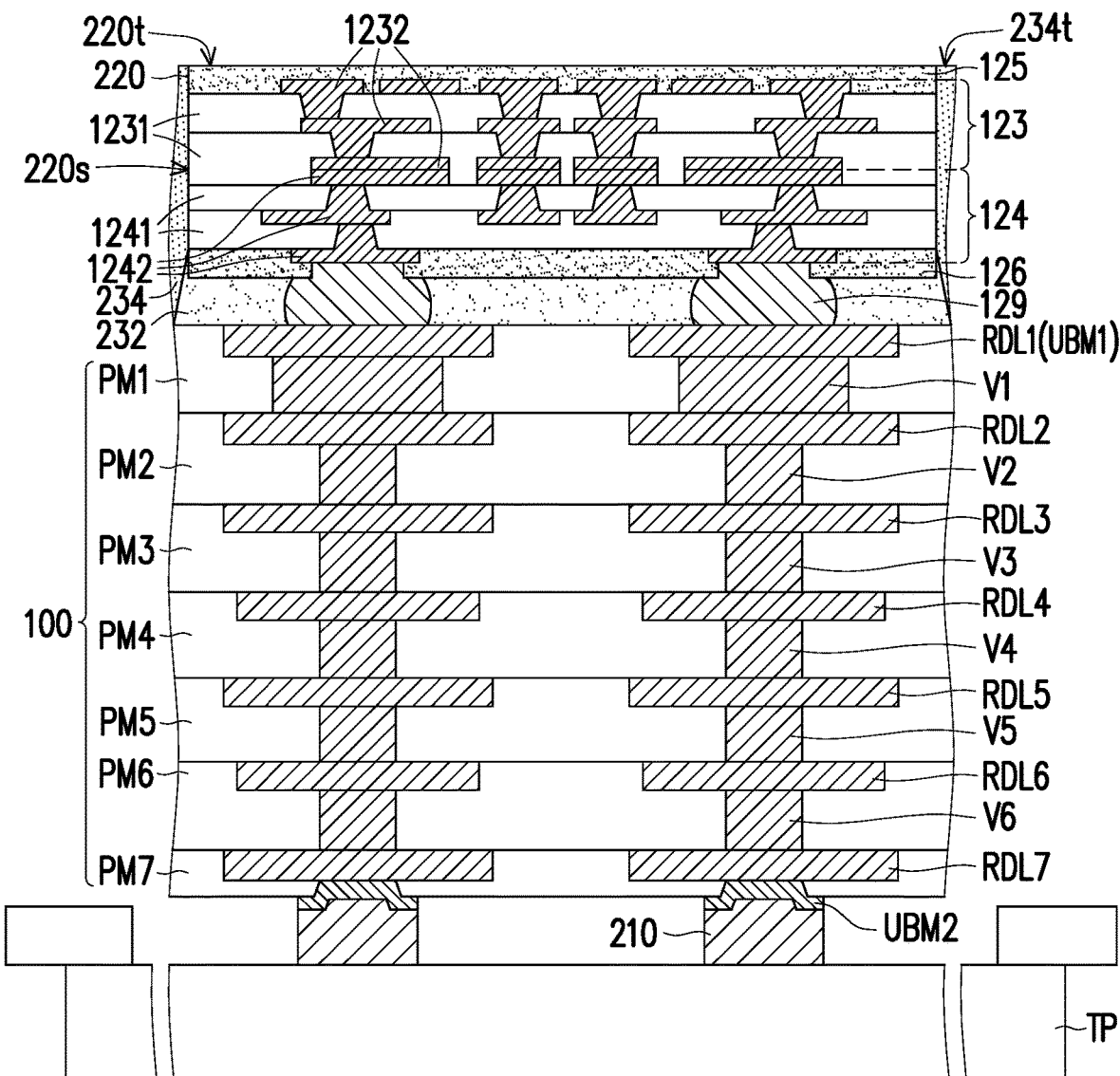
Figure 4E:
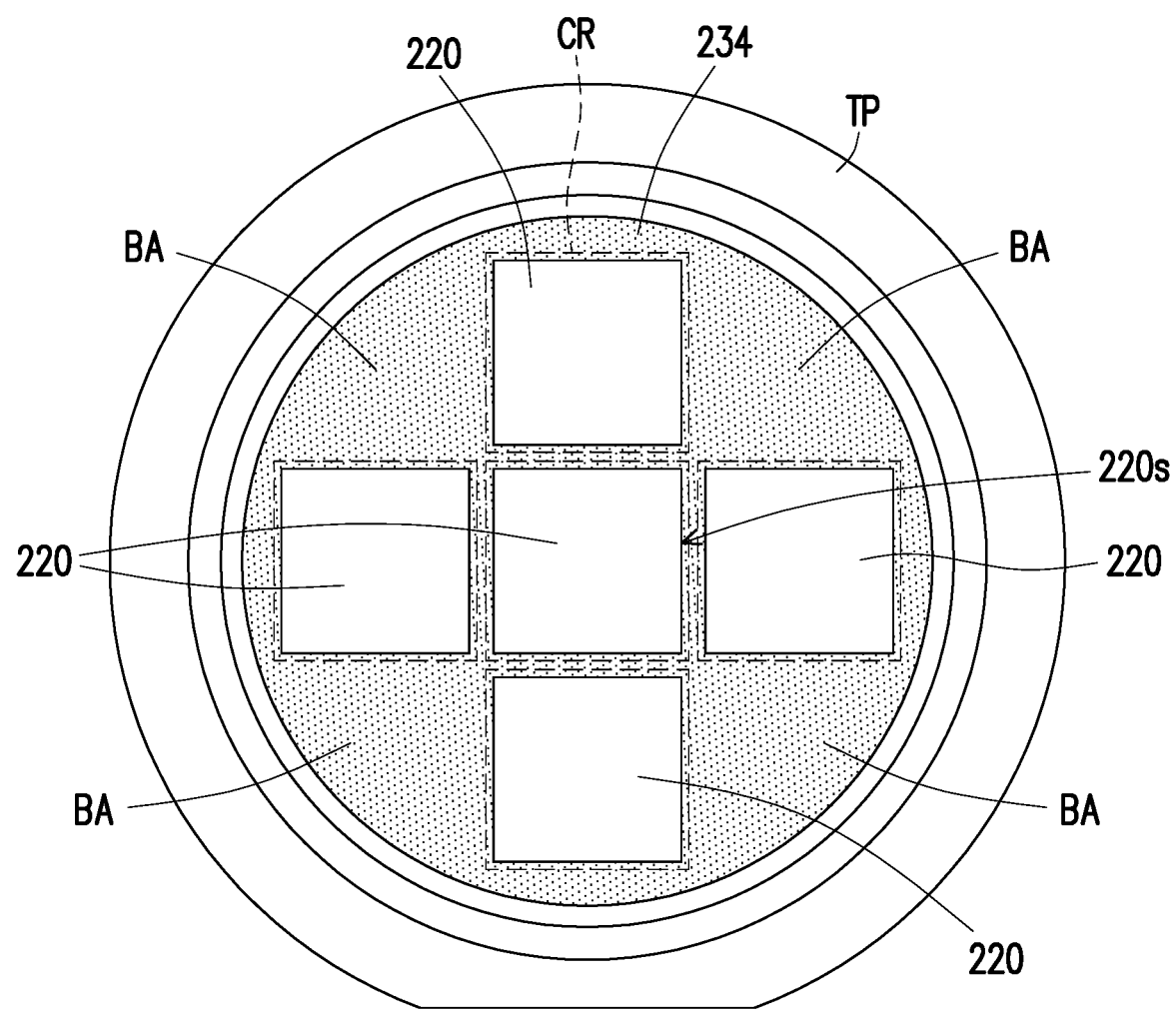

Referring to FIGS. 3E and 4E, an insulating encapsulation 234 is formed over the first side 100*a* of the redistribution structure 100 to cover the circuit substrate 220 and the underfill layer 232. The material of the insulating encapsulation 234 may be similar to that of the insulating encapsulation 130 described in FIGS. 1F and 2F. In some embodiments, the insulating encapsulation 234 is formed by such as a molding process, an injection process, combinations of these, or the like. The formation process of the insulating encapsulation 234 may be similar to that of the insulating encapsulation 130 described in FIGS. 1F and 2F, except that the blank areas BA may be unmasked. The insulating encapsulation 234 may be formed over the redistribution structure 100 to cover the circuit substrates 220 and the underfill layer 232 and may also spread in the blank areas BA as shown in FIG. 4E. In some embodiments, the insulating encapsulation 234 is interposed between neighboring circuit substrates 220 and may extend along the rest portion of the sidewalls 220*s* of the respective circuit substrate 220 which is not covered by the underfill layer 232. In some embodiments, the top surface 234*t* of the insulating encapsulation 234 is substantially leveled with the top surfaces 220*t* of the circuit substrates 220. For example, the planarization process is performed to level the insulating encapsulation 234 and the circuit substrates 220. Alternatively, the planarization process is omitted.

Figure 3F:
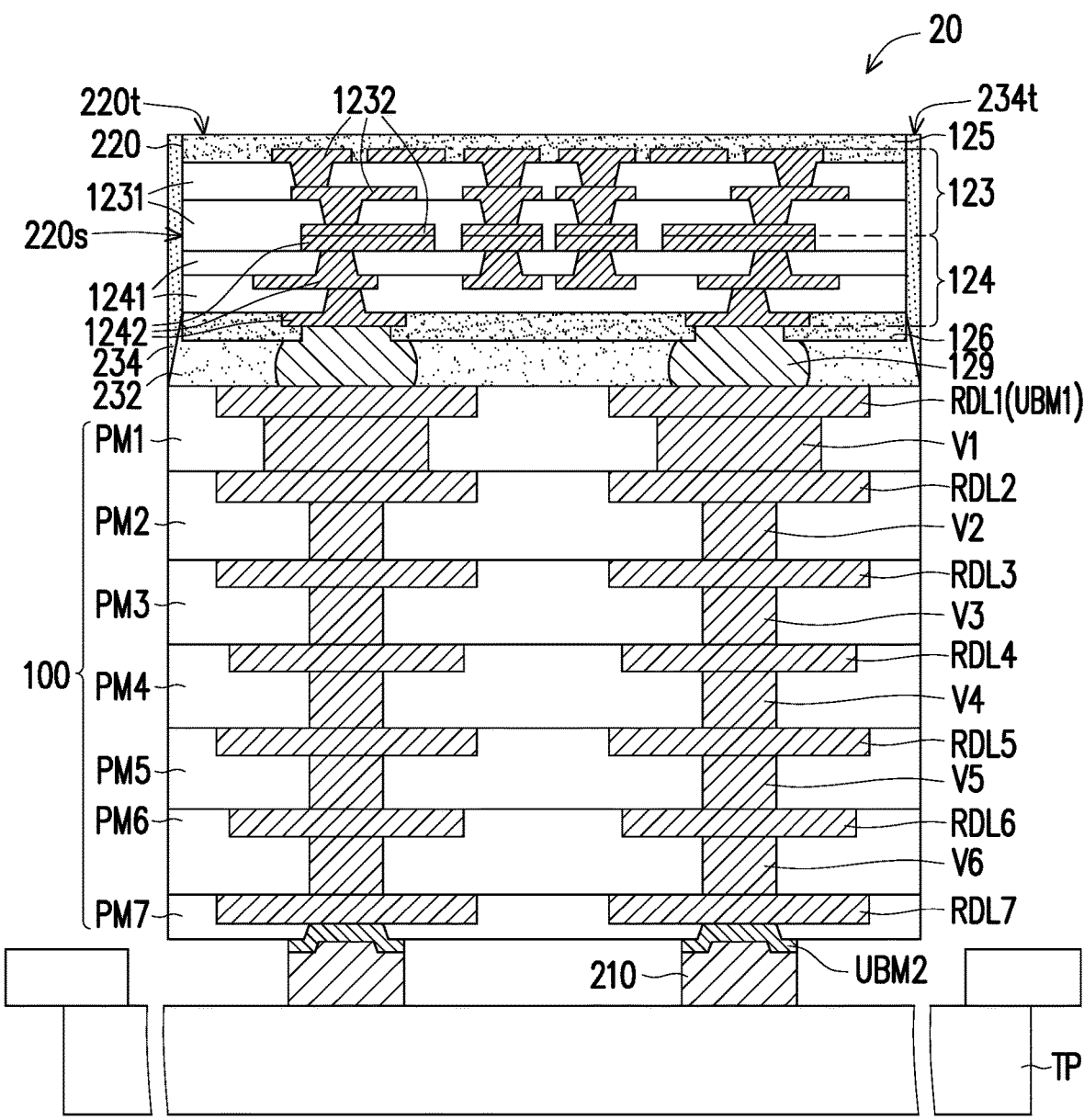
Figure 4F:
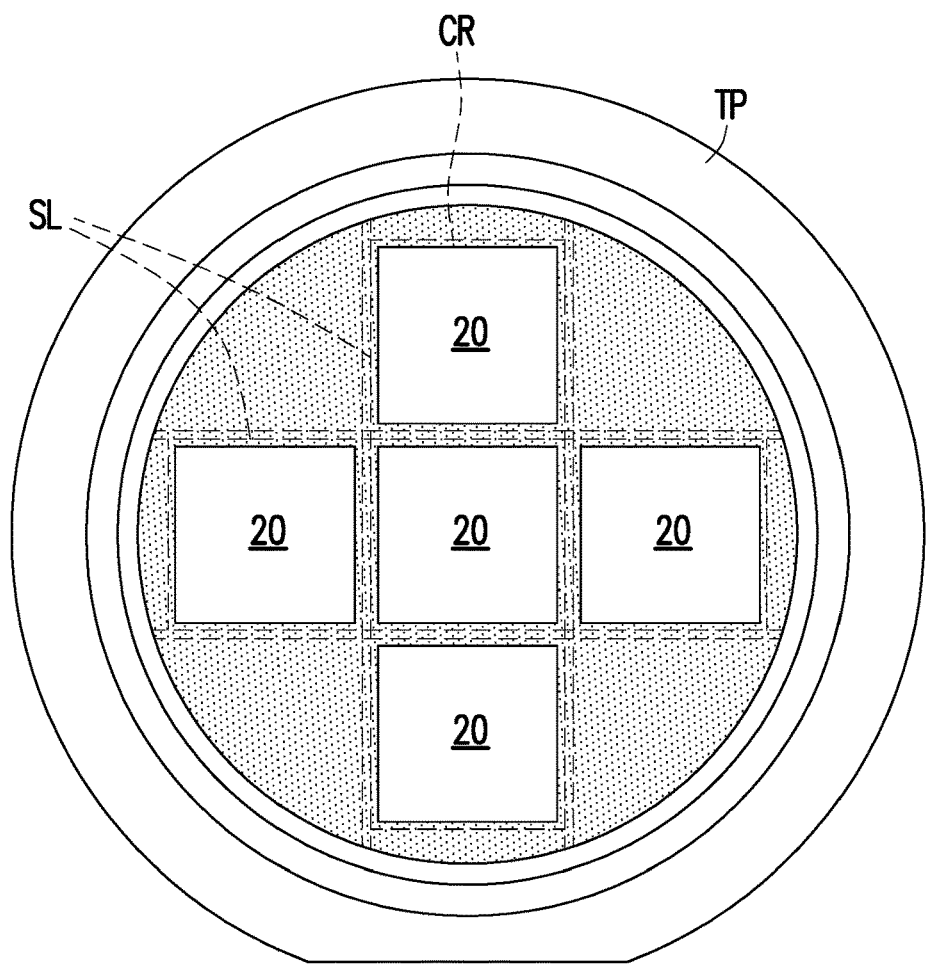

Referring to FIGS. 3F and 4F, a singulation process may be performed to cut along the scribe lines SL to form a plurality of semiconductor structures 20. The singulation process may be similar to the process described in FIGS. 1G and 2G, so the detailed descriptions are not repeated for the sake of brevity. For example, the insulating encapsulation 234 and the underlying redistribution structure 100 are cut through to form substantially coterminous sidewalls 20*s* of the semiconductor structure 20. In some embodiments, the dicing tool may cut through the insulating encapsulation 234, the underlying underfill layer 232, and the underlying redistribution structure 100 to form substantially coterminous sidewalls 20*s* of the semiconductor structure 20.

Figure 3G:
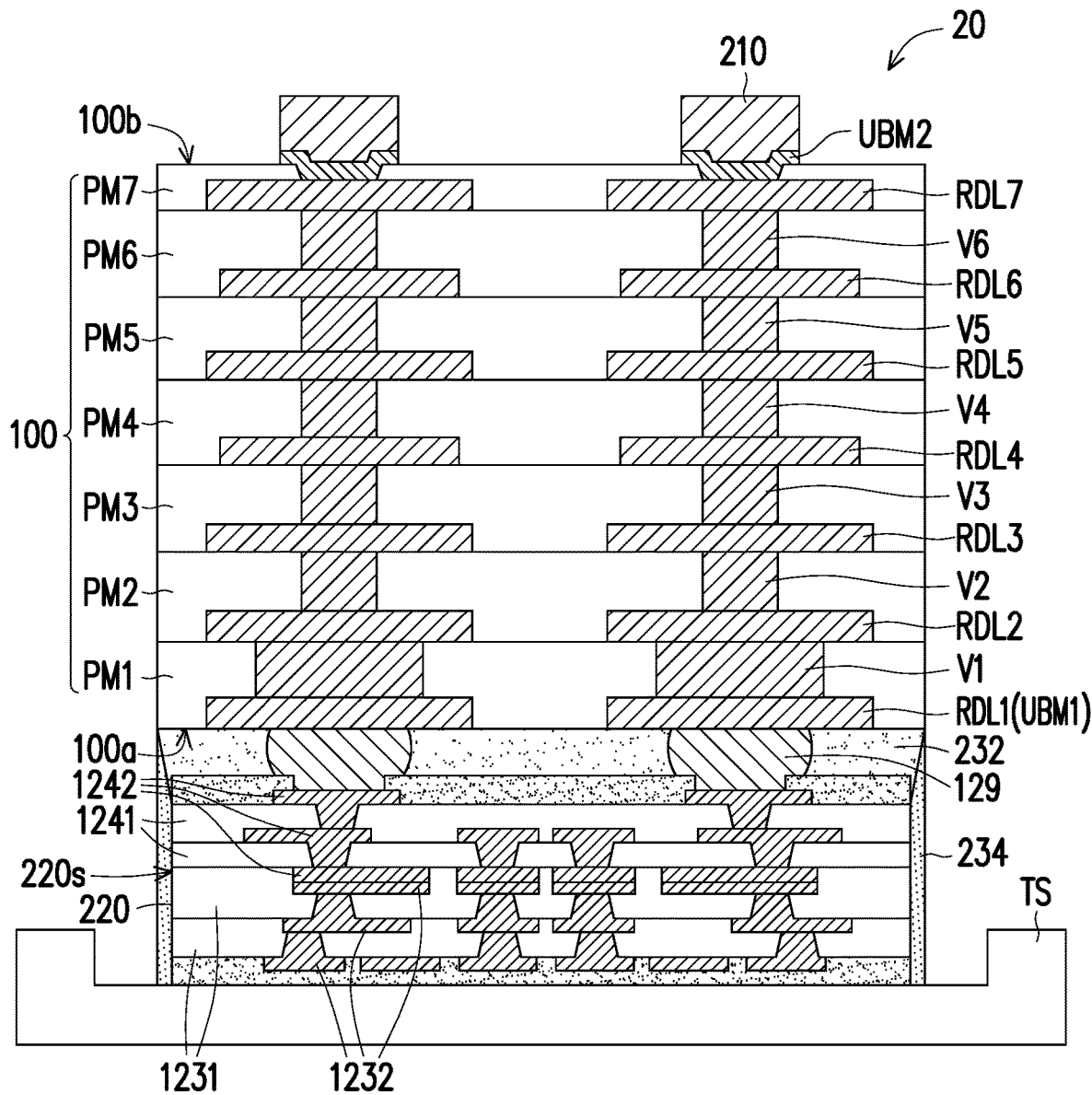
Figure 4G:
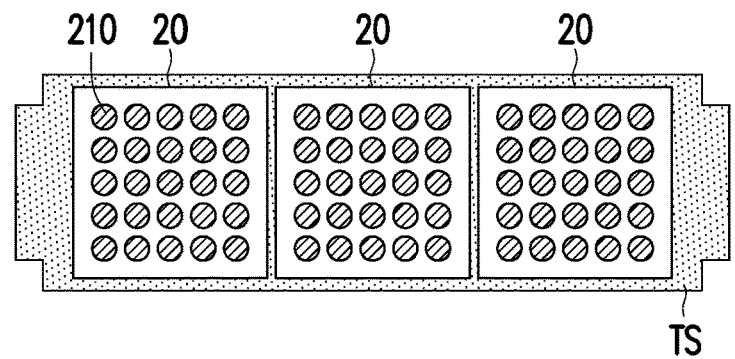

Referring to FIGS. 3G and 4G and also with reference to FIG. 3F, after the singulation process, the semiconductor structures 20 are removed from the tape frame TP and then accommodated on the tray cassette TS. For example, the respective semiconductor structure 20 includes the redistribution structure 100, the circuit substrate 220 disposed over the first side 100a of the redistribution structure 100 and coupled to the redistribution structure 100 through the conductive joints 129, the conductive terminals 210 distributed on the second side 100b of the redistribution structure 100 opposite to the conductive joints 129, the underfill layer 232 disposed between the redistribution structure 100 and the circuit substrate 220 to cover the conductive joints 129, the insulating encapsulation 234 disposed on the first side 100a of the redistribution structure 100 to cover the circuit substrate 220 and the underfill layer 232.

The redistribution structure 100 may include first conductive pattern RDL1 (i.e. the first UBM pattern UBM1) at the first side 100a and the second UBM pattern UBM2 at the second side 100b. The first conductive pattern RDL1 may be substantially leveled with the first dielectric layer PM1, and the conductive joints 129 are formed on the first conductive pattern RDL1. The second UBM pattern UBM2 may have a portion disposed on the top surface of the outermost one of the dielectric layers (e.g., the seventh dielectric layer PM7), and the conductive terminals 210 are formed on the second UBM pattern UBM2. The circuit substrate 220 may be a coreless circuit board or may be replaced with other types of the support substrate (e.g., PCB, a system board, or the like).

FIGS. 5-10 are schematic cross-sectional views of variations of a semiconductor structure in accordance with some embodiments. Unless specified otherwise, the materials and the formation methods of the components described herein are essentially the same as the like components, which are denoted by like reference numerals shown in FIGS. 1-4.

Figure 5:
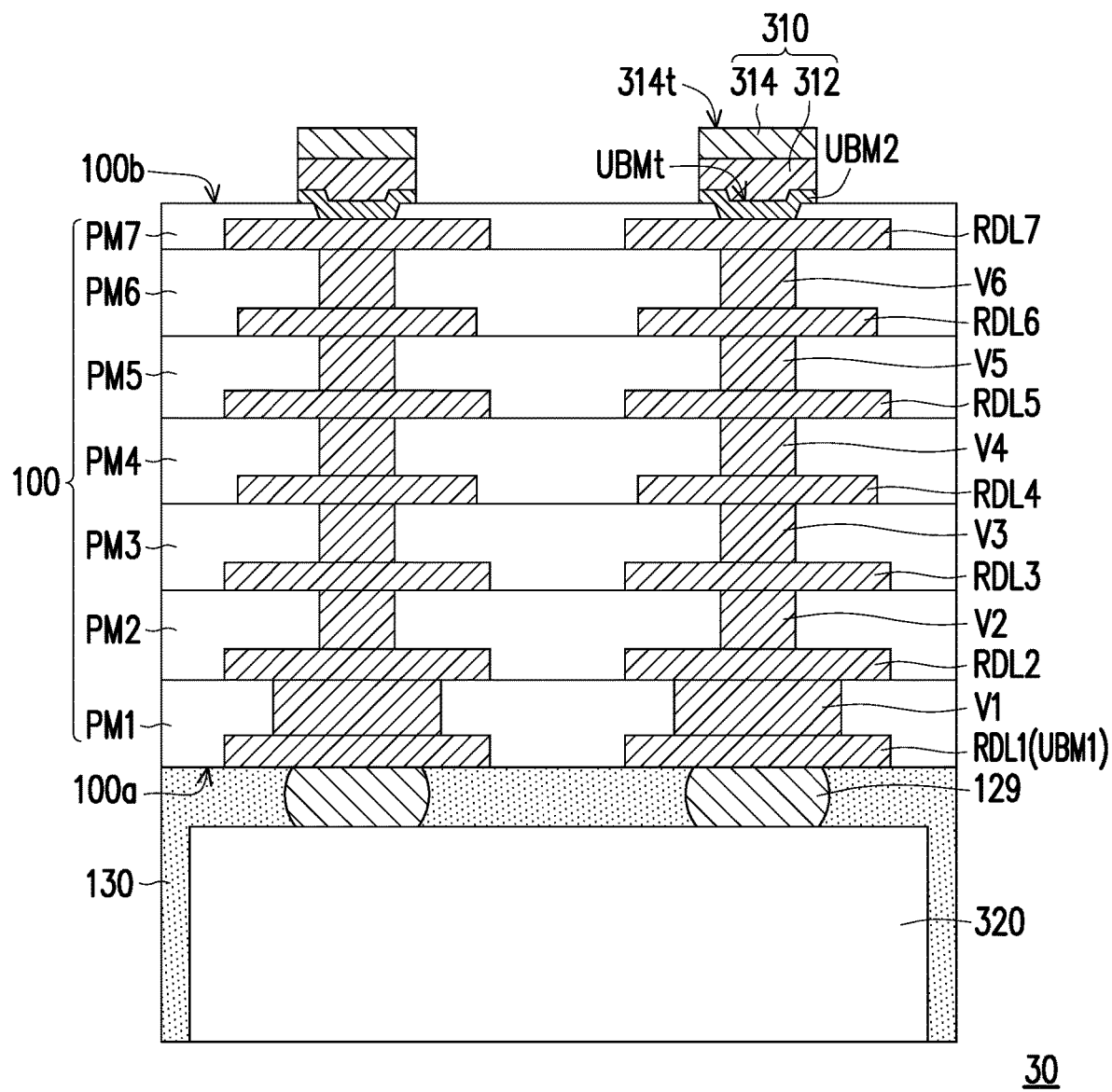
FIGS. 5-10 are schematic cross-sectional views of variations of a semiconductor structure in accordance with some embodiments.
Figure 6:
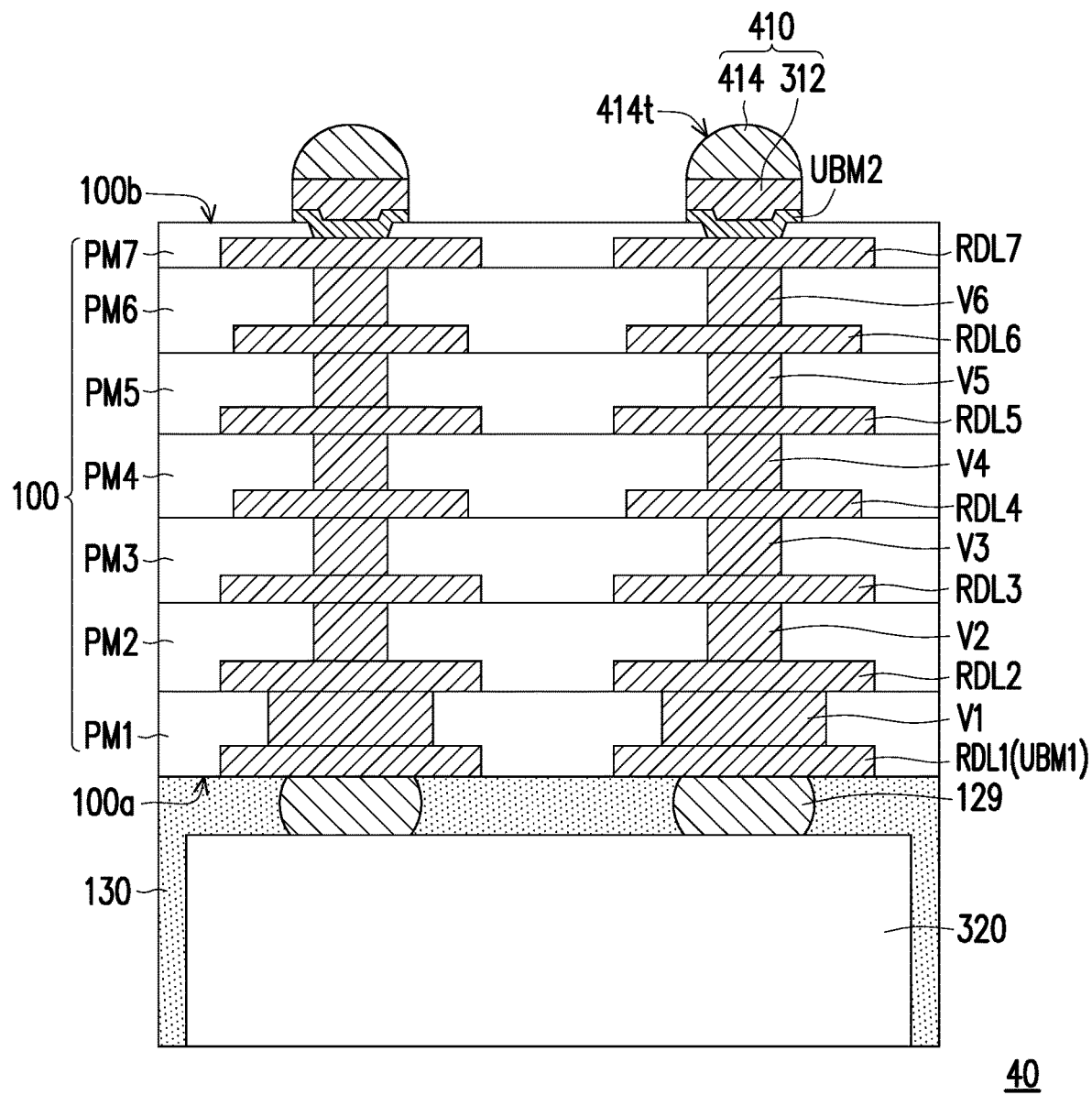

Referring to FIGS. 5-6, semiconductor structures 30 and 40 are respectively provided. The semiconductor structures 30 and 40 may be similar to the semiconductor structure 10 described in FIG. 1H and/or the semiconductor structure 20 described in FIG. 3G. For example, the semiconductor structure 30 includes the redistribution structure 100, the circuit substrate 320 coupled to the first side 100a of the redistribution structure 100 through the conductive joints 129, the insulating encapsulation 130 disposed on the first side 100a of the redistribution structure 100 to cover the circuit substrate 320, and the conductive terminals 310 coupled to the second side 100b of the redistribution structure 100 through the second UBM pattern UBM2. The details regarding the circuit substrate 320 are not shown in FIG. 5, but it should be noted that the circuit substrate 320 may be similar to the circuit substrate (120 or 220) or other types of support substrate. In some embodiments, the insulating encapsulation 130 may be replaced with the underfill layer 232 and the insulating encapsulation 234 described in FIG. 3G.

The first conductive pattern RDL1 (i.e. the first UBM pattern UBM1) may be substantially coplanar with the first dielectric layer PM1. In some embodiments, a portion of the first conductive pattern RDL1 is connected to the conductive joints 129 and the rest portion of the first conductive pattern RDL1 may be covered by the insulating encapsulation 130. The topmost one of the conductive patterns (e.g., the seventh conductive pattern RDL7) may be covered by the topmost one of the dielectric layers (e.g., the seventh dielectric layer PM7), and the second UBM pattern UBM2 may be formed on the topmost one of the conductive patterns (e.g., the seventh conductive pattern RDL7) inside the openings of the topmost one of the dielectric layers (e.g., the seventh dielectric layer PM7). The second UBM pattern UBM2 may be conformally formed on the topmost one of the dielectric layers (e.g., the seventh dielectric layer PM7) and into the openings of the topmost one of the dielectric layers (e.g., the seventh dielectric layer PM7) to be in physical and electrical contact with the topmost one of the conductive patterns (e.g., the seventh conductive pattern RDL7). For example, the second UBM pattern UBM2 has the recessed top surface UBMt. A portion of the second UBM pattern UBM2 may extend from the openings of the topmost one of the dielectric layers (e.g., the seventh dielectric layer PM7) to the top surface of the seventh dielectric layer PM7.

The respective conductive terminal 310 may include a pillar portion 312 formed on the second UBM pattern UBM2 and a cap portion 314 overlying the pillar portion 312. For example, the pillar portion 312 is formed over and electrically couple to the top surface of the second UBM pattern UBM2. The pillar portions 312 and/or the cap portion 314 may be formed through plating. For example, the material of the pillar portions 312 may include copper, a copper alloy, or the like. The cap portions 314 may be formed on the top surface of the pillar portions 312, and may include a material different from the underlying pillar portions 312. In some embodiments, the cap portions 314 include solder materials (e.g., lead-free or lead-containing eutectic alloy). In some embodiments, the cap portions 314 include nickel, palladium, platinum, gold or the like and alloys such as ENEPIG (electroless nickel, electroless palladium, immersion gold), ENIG (electroless nickel, immersion gold), or other suitable conductive material. In some embodiments, the formation of the cap portions 314 includes plating a solder layer over each of the pillar portions 312. A reflow process is optionally performed on the solder layer to form the cap portions 314. The pillar portions 312 may be formed of non-reflowable materials, and the sidewalls of the pillar portions 312 may remain to be substantially vertical after the reflow. In some embodiments, the cap portion 314 and the underlying pillar portion 312 may have coterminous sidewalls. For example, the sidewalls of the cap portion 314 may be substantially vertical. In some embodiments, the cap portion 314 has a substantially planar top surface 314t connected to the vertical sidewalls.

Continue to FIG. 6, the semiconductor structure 40 is similar to the semiconductor structure 30 shown in FIG. 5, except that the cap portions 414 of the conductive terminals 410 have rounded top surfaces 414t. For example, the cap portions 414 may be formed by plating, ball placement, or other suitable deposition techniques. In some embodiments, the reflow process is performed to form the pillar portions 312 with the cap portions 414 overlying the pillar portions 312. During the reflow process, the cap portions 414 may be reshaped into the desired bump shape.

Figure 7:
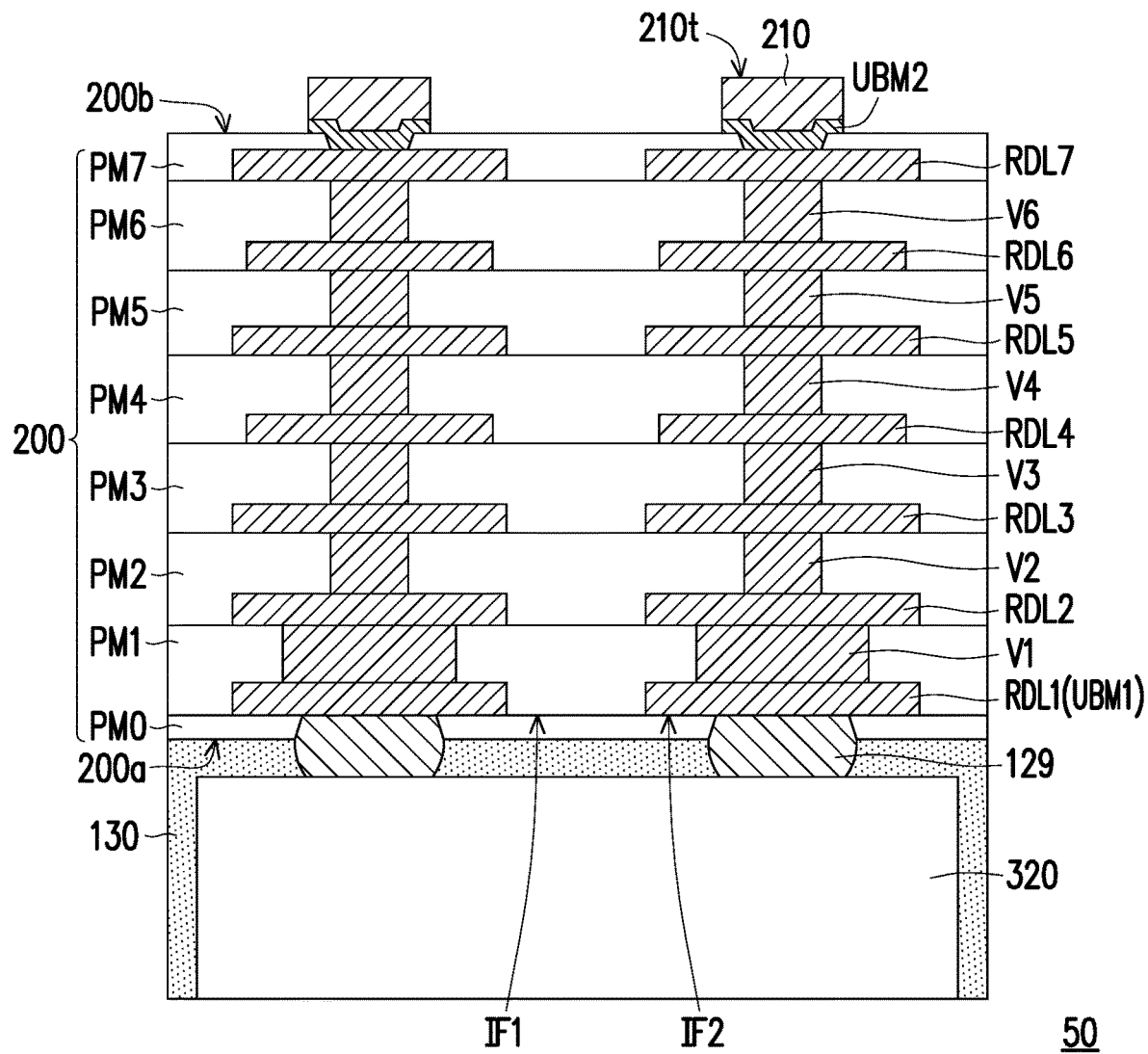
Figure 8:
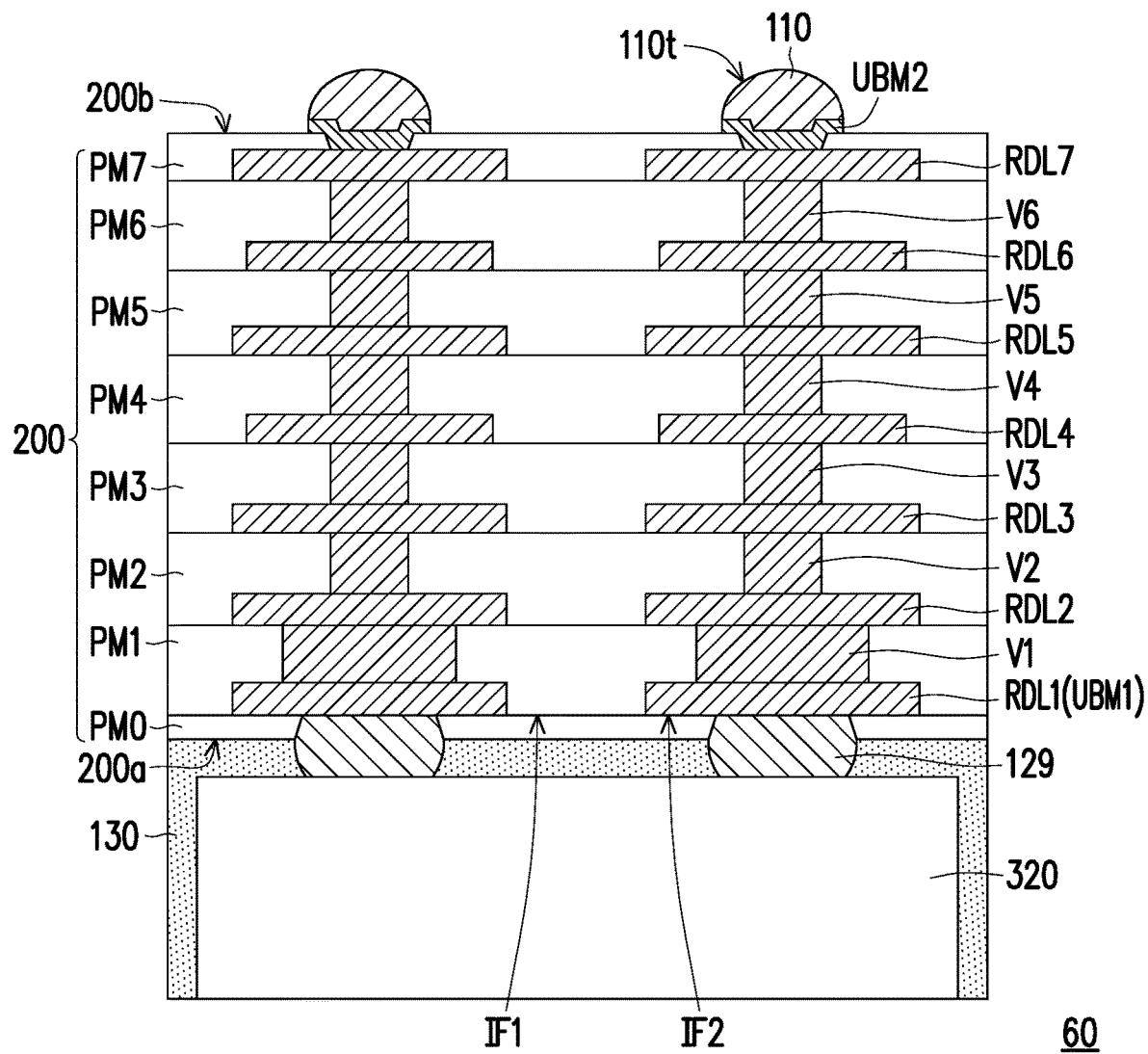

Referring to FIGS. 7-8, semiconductor structures 50 and 60 are respectively provided. The semiconductor structures 50 and 60 may be similar to the semiconductor structure 10 described in FIG. 1H and/or the semiconductor structure 20 described in FIG. 3G. For example, the semiconductor structure 50 includes a redistribution structure 200, the circuit substrate 320 coupled to the first conductive pattern RDL1 (i.e. the first UBM pattern UBM1) of the redistribution structure 200 through the conductive joints 129, the insulating encapsulation 130 disposed on the first side 200a of the redistribution structure 100 to cover the circuit substrate 320, and the conductive terminals 210 coupled to the second side 100b of the redistribution structure 100 through the second UBM pattern UBM2. In some embodiments, the insulating encapsulation 130 may be replaced with the underfill layer 232 and the insulating encapsulation 234 described in FIG. 3G. The circuit substrate 320 may be replaced with the circuit substrate (120 or 220) or other types of support substrate.

The redistribution structure 200 may be similar to the redistribution structure 100 described above, except that the redistribution structure 200 further includes a polymer layer PM0 disposed at the first side 200a. For example, the polymer layer PM0 underlying the first dielectric layer PM1 includes openings (not labeled) accessibly revealing at least a portion of the first conductive pattern RDL1 (i.e. the first UBM pattern UBM1), and a portion of the conductive joints 129 are formed in the openings of the polymer layer PM0 to be physically and electrically connected to the first conductive pattern RDL1 (i.e. first UBM pattern UBM1). For example, the portion of the conductive joints 129 is laterally covered by the polymer layer PM0 and the rest portion of the conductive joints 129 is laterally covered by the insulating encapsulation 130. In some embodiments, the first dielectric layer PM1 is substantially leveled with the first conductive pattern RDL1, and the polymer layer PM0 is formed on the first dielectric layer PM1 and the first conductive pattern RDL1. A first interface IF1 of the first dielectric layer PM1 and the polymer layer PM0 may be substantially leveled with a second interface IF2 of first conductive pattern RDL1 and the polymer layer PM0. In some embodiments, the material of the polymer layer PM0 is the same or similar to the material of the overlying first dielectric layer PM1. Alternatively, the material of the polymer layer PM0 is different from the material of the overlying first dielectric layer PM1. In some embodiments, the thickness of the polymer layer PM0 is less than the thickness of the overlying first dielectric layer PM1. Alternatively, the thickness of the polymer layer PM0 is substantially equal to or greater than the thickness of the overlying first dielectric layer PM1.

In some embodiments, the polymer material is initially formed on the release layer over the temporary carrier by such as lamination, spin-coating, CVD, a combination thereof, or the like, and then the first conductive pattern RDL1 is formed on the polymer material and the first conductive via V1 is subsequently formed on the first conductive pattern RDL1. Next, the first dielectric layer PM1 is formed on the polymer material to cover the first conductive pattern RDL1 and the first conductive via V1. Additional conductive patterns (e.g., RDL2-RDL7), conductive vias (e.g., V2-V6), and dielectric layers (e.g., PM2-PM7) are formed on the first dielectric layer PM1 and the first conductive via V1. The formation step may be similar to the processes described in FIG. 1A. Next, the second UBM pattern UBM2 and the conductive terminals 210 may be sequentially formed on the seventh dielectric layer PM7 and may be electrically coupled to the underlying conductive patterns. After forming the conductive terminals 210, the temporary carrier and the release layer may be removed to expose the polymer material. The resulting structure may be flipped over to be placed on the tape frame for further processing. At this stage, the polymer material may face outwardly for processing. Subsequently, a portion of the polymer material is removed to form the polymer layer PM0 with openings accessibly exposing at least a portion of the first conductive pattern RDL1. The openings of the polymer layer PM0 may be formed by such as laser drilling, lithography and etching, or other suitable processes. The circuit substrate 320 may be mounted on the redistribution structure 200 with the conductive joints 129 partially disposed in the openings of the polymer layer PM0 to be in physical and electrical contact with the first conductive pattern RDL1. The mounting step and the subsequent steps may be similar to the processes shown in FIG. 3C-3G.

In some embodiments, the polymer layer PM0 is formed before mounting the circuit substrate 320. For example, a part of the redistribution structure 200 including the dielectric layers (e.g., PM1-PM7), the conductive patterns (e.g., RDL1-RDL7), and the conductive vias (e.g., V1-V6) is formed over the temporary carrier, and then the second UBM pattern UBM2 and the conductive terminals 210 are subsequently formed at the second side 200b of the part of the redistribution structure 200. The formation step may be similar to the process shown in FIG. 3A. Next, the temporary carrier is de-bonded to expose the first dielectric layer PM1 and the first conductive pattern RDL1, and then the structure may be turned upside down to be placed on the tape frame for further processing. The de-bonding step and the placement step may be similar to the processes shown in FIG. 3B. Subsequently, the polymer layer PM0 may be formed on the first dielectric layer PM1 and the first conductive pattern RDL1. For example, the polymer material is deposited on the first dielectric layer PM1 and the first conductive pattern RDL1 by such as lamination, spin-coating, CVD, a combination thereof, or the like, and then a portion of the polymer material is removed to accessibly expose the underlying first conductive pattern RDL1 by such as laser drilling. Other removal process (e.g., lithography and etching processes) may be used. After forming the polymer layer PM0, the circuit substrate 320 may be mounted on the redistribution structure 200 through the conductive joints 129. The bottoms of the conductive joints 129 may be confined within the openings of the polymer layer PM0. The mounting step and the subsequent steps may be similar to the processes shown in FIG. 3C-3G.

Continue to FIG. 8, the semiconductor structure 60 is similar to the semiconductor structure 50, except that the conductive terminals 110 are formed over the redistribution structure 200. For example, the conductive terminals 110 have cured top surfaces 110t, while the conductive terminals 210 of the semiconductor structure 50 shown in FIG. 7 have substantially planar top surfaces 210t. The conductive terminals 110 are similar to the conductive terminals 110 described in FIG. 1B, so the detailed descriptions are not repeated for the sake of brevity.

Figure 9:
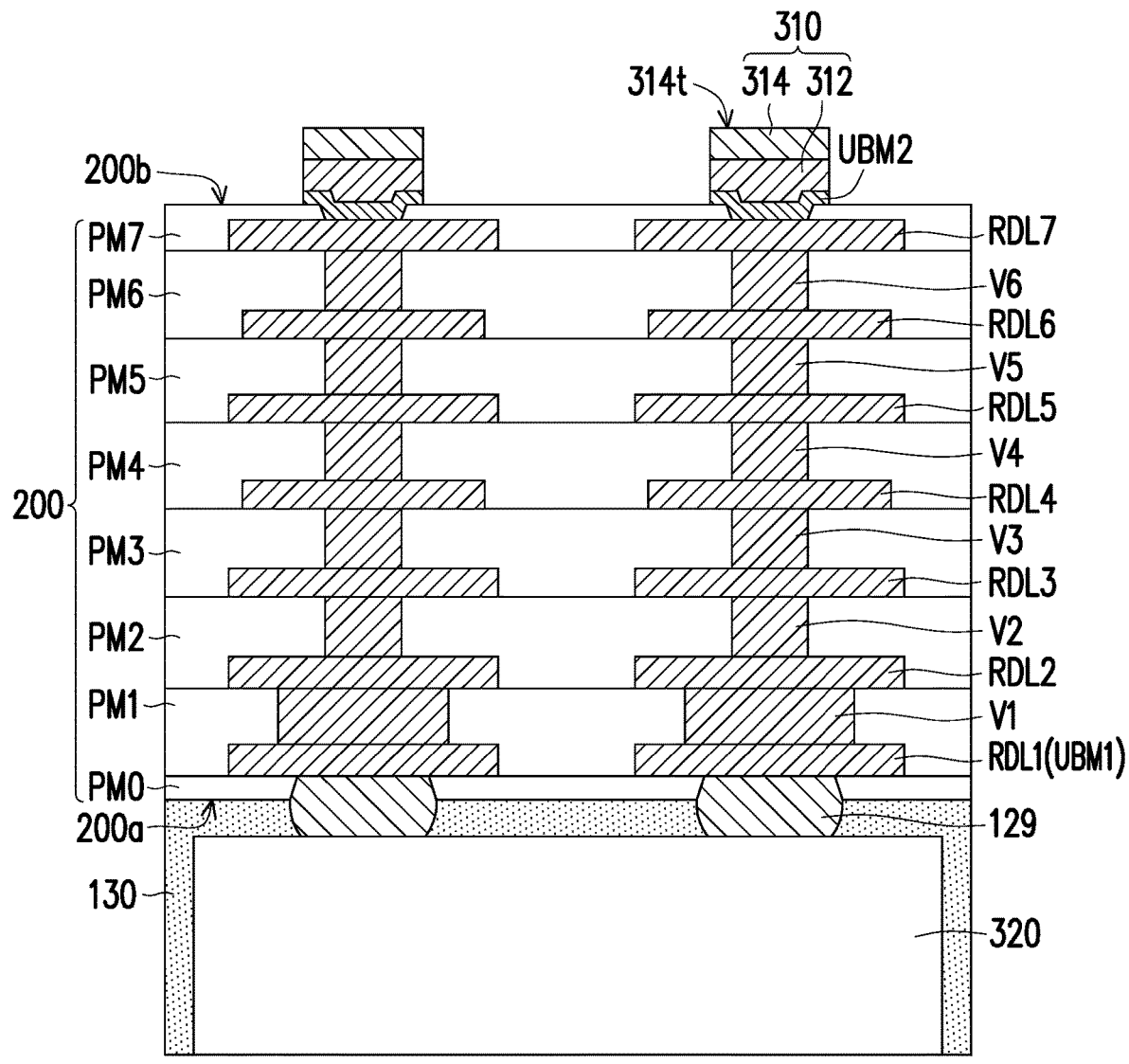
Figure 10:
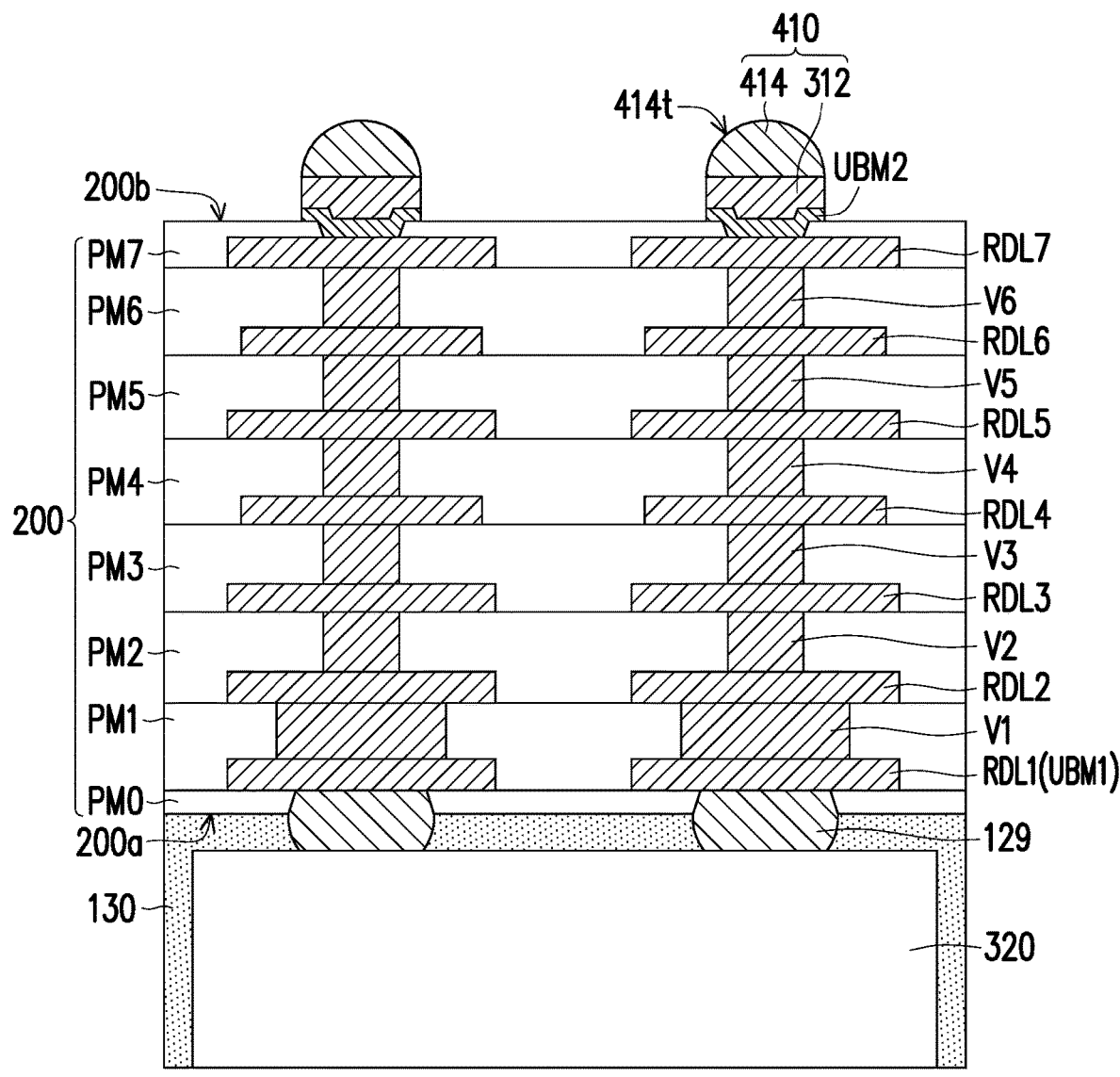

Referring to FIGS. 9-10, semiconductor structures 70 and 80 are respectively provided. The semiconductor structures 70 and 80 may be similar to the semiconductor structures 50 and 60 described in FIGS. 7-8, except for the conductive terminals formed on the redistribution structure 200. For example, the semiconductor structure 70 includes the redistribution structure 200 having the first side 200a and the second side 200b opposite to each other, the conductive terminals 310 formed on the second UBM pattern UBM2 at the second side 200b, the conductive joints 129 formed at the first side 200a and coupling the first UBM pattern UBM1 of the redistribution structure 200 and the circuit substrate 320, and the insulating encapsulation 130 formed on the polymer layer PM0 of the redistribution structure 200 at the first side 200a to cover the circuit substrate 320. In some embodiments, the insulating encapsulation 130 may be replaced with the underfill layer 232 and the insulating encapsulation 234 described in FIG. 3G. The circuit substrate 320 may be replaced with the circuit substrate (120 or 220) or other types of support substrate. The respective conductive terminal 310 may include the pillar portion 312 formed on the second UBM pattern UBM2 and the cap portion 314 overlying the pillar portion 312. The cap portion 314 may have the substantially planar top surface 314t. The conductive terminals 310 may be similar to the conductive terminals 310 described in FIG. 5, so the detailed descriptions are not repeated for the sake of brevity.

Continue to FIG. 10, the semiconductor structure 80 is similar to the semiconductor structure 70, except for the conductive terminals 410. For example, the respective conductive terminal 410 may include the pillar portion 312 formed on the second UBM pattern UBM2 and the cap portion 414 overlying the pillar portion 312. The cap portion 414 may have the curved top surface 414t. The conductive terminals 410 may be similar to the conductive terminals 410 described in FIG. 6, so the detailed descriptions are not repeated for the sake of brevity.

Figure 11:
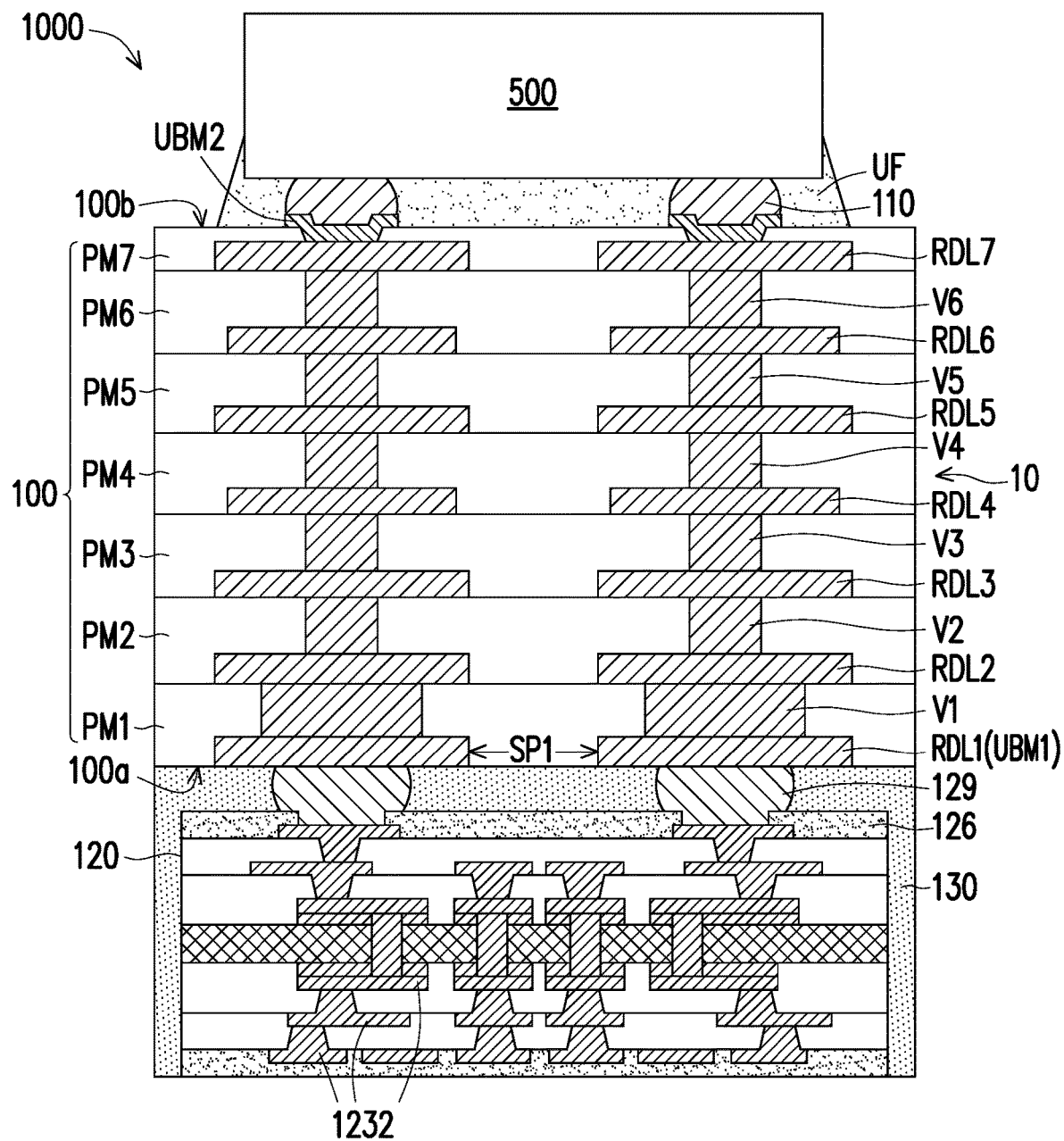
FIG. 11 is a schematic cross-sectional view of an application of a semiconductor structure in accordance with some embodiments.

FIG. 11 is a schematic cross-sectional view of an application of a semiconductor structure in accordance with some embodiments. Like reference numbers are used to designate like elements.

Referring to FIG. 11, a system package 1000 is provided. For example, the system package 1000 includes the semiconductor structure 10 and a semiconductor device 500 disposed on the redistribution structure 100. The semiconductor device 500 may be coupled to the semiconductor structure 10 through the conductive terminals 110. For example, the semiconductor device 500 including active and/or passive components is electrically coupled to the circuit substrate 120 through the conductive terminals 110 and the redistribution structure 100. The semiconductor structure 10 may be similar to the semiconductor structure 10 described in FIG. 1H. The semiconductor structure 10 of the system package 1000 may be replaced with any one of the semiconductor structure discussed elsewhere in the disclosure (e.g., the semiconductor structure 20 shown in FIG. 3F, the semiconductor structure 30 shown in FIG. 5, the semiconductor structure 40 shown in FIG. 6, the semiconductor structure 50 shown in FIG. 7, the semiconductor structure 60 shown in FIG. 8, the semiconductor structure 70 shown in FIG. 9, or the semiconductor structure 80 shown in FIG. 10).

In some embodiments, the semiconductor structure 10 and the semiconductor device 500 are separately fabricated. The semiconductor device 500 may be placed on the conductive terminals 110 by such as a pick-and-place process, a flip-chip process, or other suitable techniques. In some embodiments, the semiconductor device 500 is placed in and in physical contact with the conductive terminals 110, and then a reflow process may be performed to bond the conductive terminals 110 of the semiconductor structure 10 to the semiconductor device 500. However, any suitable bonding technique may be used to couple the semiconductor device 500 and the semiconductor structure 10.

In some embodiments, the semiconductor device 500 includes integrated circuit devices, such as transistors, capacitors, inductors, resistors, metallization layers, external connectors, and the like, therein, as desired for a particular functionality. The semiconductor device 500 may be or may include at least one die(s). For example, the semiconductor device 500 may be or may include a logic die, a microprocessor die (e.g., a central processing unit (CPU) die), a memory die (e.g., a DRAM die, SRAM die, a stacked memory die, a high-bandwidth memory (HBM) die, etc.), an RF die, a mixed signal die, I/O die, combination of these, or the like. The semiconductor device 500 may include more than one of the same types of die, or may include different dies. In some embodiments, the semiconductor device 500 may be or may include package component(s). For example, the semiconductor device 500 may be or may an integrated fan-out (InFO) package, a system-on-a-chip device, a chip-on-wafer device, the like, or a combination thereof. For example, the semiconductor device 500 includes at least one die encapsulated by a molding compound and redistribution structures disposed on the molding compound and the die. In some embodiments, the conductive terminals 110 of the semiconductor structure 10 may be electrically coupled to the die of the semiconductor device 500 through the redistribution structures of the semiconductor device 500. It is noted that the types of the semiconductor device 500 construe no limitation in the disclosure.

According to some embodiments, a semiconductor structure includes a first UBM pattern, a first conductive via, and a first dielectric layer laterally covering the first UBM pattern and the first conductive via. Entireties of a top surface and a bottom surface of the first UBM pattern are substantially planar. The first conductive via landing on the top surface of the first UBM pattern includes a vertical sidewall and a top surface connected to the vertical sidewall, and a planarized mark is on the top surface of the first conductive via. A bottom surface of the first dielectric layer is substantially flush with the bottom surface of the first UBM, and a top surface of the first dielectric layer is substantially flush with the top surface of the first conductive via.

According to some alternative embodiments, a semiconductor structure includes a first UBM pattern covered by a first dielectric layer, a first conductive via, a conductive joint, and a polymer layer. A bottom planar surface of the first UBM pattern is substantially leveled with a bottom planar surface of the first dielectric layer. The first conductive via is disposed on a top planar surface of the first UBM pattern and laterally covered by the first dielectric layer, and a top planar surface of the first conductive via is substantially leveled with a top planar surface of the first dielectric layer. The conductive joint is disposed on the bottom planar surface of the first UBM pattern. The polymer layer underlying the first dielectric layer laterally covers the conductive joint, and an interface of the first dielectric layer and the polymer layer is substantially flush with an interface of first UBM pattern and the polymer layer.

According to some alternative embodiments, a manufacturing method of a semiconductor structure e includes at least the following steps. A first UBM pattern is formed over a temporary carrier. A first conductive via is formed on the first UBM pattern. A first dielectric material is formed on the temporary carrier to cover the first UBM pattern and the first conductive via. The first dielectric material and the first conductive via are planarized to form a top planar surface of a first dielectric layer and a top planar surface of the first conductive via, where the top planar surfaces of the first dielectric layer and the first conductive via include planarized marks. The temporary carrier is removed to reveal a bottom planar surface of the first UBM pattern and a bottom planar surface of the first dielectric layer after the planarizing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a redistribution structure comprising:
a topmost pad embedded in a topmost dielectric layer, bottom surfaces of the topmost pad and the topmost dielectric layer being substantially coplanar;
a topmost under-bump metallization (UBM) pattern directly disposed on top surfaces of the topmost pad and the topmost dielectric layer;
a bottommost UBM pad embedded in a bottommost dielectric layer, bottom surfaces of the bottommost UBM pad and the bottommost dielectric layer being substantially coplanar;
a bottommost via disposed on a top surface of the bottommost UBM pad and laterally covered by the bottommost dielectric layer, top surfaces of the bottommost via and the bottommost dielectric layer being substantially coplanar; and
a top via connected to the bottom surface of the topmost pad, wherein a dimension of the topmost via is less than that of the bottommost via;
a topmost conductive terminal landing on a recessed top surface of the topmost UBM pattern; and
a bottommost conductive terminal landing on the bottom surface of the bottommost UBM pad which is substantially planar.

2. The semiconductor structure of claim 1, wherein the topmost conductive terminal comprises a pillar portion landing on the recessed top surface.

3. The semiconductor structure of claim 2, wherein the pillar portion of the topmost conductive terminal is of a solder material.

4. The semiconductor structure of claim 2, wherein the topmost conductive terminal further comprises a cap portion overlying the pillar portion and having a material different from the pillar portion.

5. The semiconductor structure of claim 1, wherein the redistribution structure further comprises:
a middle via between the topmost via and the bottommost via, wherein a dimension of the middle via is less than the dimension of the bottommost via.

6. The semiconductor structure of claim 1, further comprising:
a circuit substrate physically and electrically connected to the bottommost conductive terminal; and
an insulating encapsulation disposed on the bottom surfaces of the bottommost UBM pad and the bottommost dielectric layer and laterally covering the bottommost conductive terminal and the circuit substrate.

7. The semiconductor structure of claim 6, wherein a sidewall of the insulating encapsulation is substantially aligned with a sidewall of the redistribution structure.

8. The semiconductor structure of claim 6, wherein bottommost surfaces of the circuit substrate and the insulating encapsulation are substantially coplanar.

9. The semiconductor structure of claim 1, wherein the redistribution structure further comprises:
a polymer layer disposed on the bottom surfaces of the bottommost UBM pad and the bottommost dielectric layer and partially covering the bottommost conductive terminal.

10. The semiconductor structure of claim 9, wherein the polymer layer and the bottommost dielectric layer are of different materials.

11. The semiconductor structure of claim 1, further comprising:
a semiconductor device physically and electrically connected to the topmost conductive terminal; and
an underfill filling in a gap between the top surface of the topmost dielectric layer and the semiconductor device and covering the topmost conductive terminal and the topmost UBM pattern.

12. A semiconductor structure, comprising:
a redistribution structure comprising:
topmost pads embedded in a topmost dielectric layer and laterally spaced apart from one another by a first spacing;
topmost UBM pattern extending from top surfaces of the topmost pads to a top surface of the topmost dielectric layer;
topmost conductive terminals landing on a recessed top surface of the topmost UBM pattern;
bottommost UBM pads embedded in a bottommost dielectric layer and laterally spaced apart from one another by a second spacing greater than the first spacing, wherein bottom surfaces of the bottommost UBM pads and the bottommost dielectric layer are planar; and
bottommost conductive terminals physically connected to the bottom surfaces of the bottommost UBM pads, wherein a pitch between adjacent two of the bottommost conductive terminals is greater than a pitch between adjacent two of the topmost conductive terminals;
a circuit substrate physically and electrically connected to the bottommost conductive terminals; and
an insulating encapsulation disposed on the bottom surfaces of the bottommost UBM pads and the bottommost dielectric layer, the insulating encapsulation laterally covering the circuit substrate and the bottommost conductive terminals.

13. The semiconductor structure of claim 12, wherein entireties of a top surface and the bottom surface of each of the bottommost UBM pads are substantially planar.

14. The semiconductor structure of claim 12, wherein the redistribution structure further comprises:
topmost vias physically connected to bottom surfaces of the topmost pads;
bottommost vias physically connected to top surfaces of the bottommost UBM pads, wherein a dimension of each of the bottommost vias is greater than a dimension of each of the topmost vias.

15. The semiconductor structure of claim 14, wherein the topmost vias and the bottommost vias comprise substantially vertical sidewalls.

16. The semiconductor structure of claim 14, wherein the topmost vias and the bottommost vias are substantially and vertically aligned and associated in one-to-one correspondence.

17. The semiconductor structure of claim 12, wherein outer sidewalls of the insulating encapsulation and the redistribution structure form a sidewall of the semiconductor structure.

18. A manufacturing method of a semiconductor structure, comprising:
forming a redistribution structure over a temporary carrier comprising:
covering a bottommost UBM pad and a bottommost via formed on the bottommost UBM pad with a bottommost dielectric layer;

planarizing the bottommost dielectric layer and the bottommost via;

forming a topmost pad over the bottommost dielectric layer and the bottommost via;

forming a topmost dielectric layer with an opening over the bottommost dielectric layer to partially cover the topmost pad;

forming a topmost UBM pattern in the opening of the topmost dielectric layer to be in direct contact with top surfaces of the topmost conductive pad and the topmost dielectric layer;

forming a topmost conductive terminal on a recessed top surface of the topmost UBM pattern;

releasing the temporary carrier to expose planar bottom surfaces of the bottommost UBM pad and the bottommost dielectric layer; and forming a bottommost conductive terminal on the planar bottom surface of the bottommost UBM pad;

coupling a circuit substrate to the redistribution structure through reflowing the bottommost conductive terminal; and forming an insulating encapsulation on the planar bottom surfaces of the bottommost UBM pad and the bottommost dielectric layer to laterally cover the circuit substrate.

19. The manufacturing method of claim 18, further comprising:

attaching the topmost conductive terminal to a tape frame before forming the bottommost conductive terminal.

20. The manufacturing method of claim 18, further comprising:

performing a singulation process on the insulating encapsulation and the redistribution structure.

* * * * *